United States Patent
Horiguchi et al.

(10) Patent No.: US 12,149,240 B2
(45) Date of Patent: Nov. 19, 2024

(54) DRIVE CONTROL CIRCUIT FOR POWER SEMICONDUCTOR ELEMENT, POWER SEMICONDUCTOR MODULE, AND POWER CONVERTER

(71) Applicant: Mitsubishi Electric Corporation, Tokyo (JP)

(72) Inventors: Takeshi Horiguchi, Tokyo (JP); Yasushige Mukunoki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/014,174

(22) PCT Filed: Aug. 25, 2020

(86) PCT No.: PCT/JP2020/032033
§ 371 (c)(1),
(2) Date: Jan. 3, 2023

(87) PCT Pub. No.: WO2022/044123
PCT Pub. Date: Mar. 3, 2022

(65) Prior Publication Data
US 2023/0261653 A1 Aug. 17, 2023

(51) Int. Cl.
*H03K 17/687* (2006.01)
*H03K 17/042* (2006.01)
*H03K 17/082* (2006.01)

(52) U.S. Cl.
CPC ... *H03K 17/6871* (2013.01); *H03K 17/04206* (2013.01); *H03K 17/0822* (2013.01)

(58) Field of Classification Search
CPC ......... H03K 17/6871; H03K 17/04206; H03K 17/0822
See application file for complete search history.

(56) References Cited

U.S. PATENT DOCUMENTS

2016/0173094 A1\* 6/2016 Choi .............. H03K 19/017518
327/109

FOREIGN PATENT DOCUMENTS

| JP | 2015-53749 A | | 3/2015 |
| JP | 2015053749 A | \* | 3/2015 |

OTHER PUBLICATIONS

International Search Report and Written Opinion mailed on Oct. 27, 2020, received for PCT Application PCT/JP2020/032033, filed on Aug. 25, 2020, 8 pages including English Translation.

\* cited by examiner

*Primary Examiner* — Metasebia T Retebo
(74) *Attorney, Agent, or Firm* — XSENSUS LLP

(57) ABSTRACT

A short-circuit detector detects an arm short circuit or a load short circuit, based on the magnitude of the gate current and the magnitude of the gate charge amount. The short-circuit detector includes: a gate current determinator that compares the magnitude of the gate current with at least one reference value; a gate charge amount determinator that compares the magnitude of the gate charge amount with at least one reference value; and a short-circuit detection logical operation circuitry that executes a logical operation of an output signal of the gate current determinator and an output signal of the gate charge amount determinator.

16 Claims, 14 Drawing Sheets

DRIVE CONTROL CIRCUIT FOR POWER SEMICONDUCTOR ELEMENT, POWER SEMICONDUCTOR MODULE, AND POWER CONVERTER

CROSS-REFERENCE TO RELATED APPLICATION

The present application is based on PCT filing PCT/JP2020/032033, filed Aug. 25, 2020, the entire contents of which are incorporated herein by reference.

TECHNICAL FIELD

The present disclosure relates to a drive control circuit for power semiconductor element, a power semiconductor module, and a power converter.

BACKGROUND ART

Conventionally, a Si-IGBT (insulated gate bipolar transistor) is widely used as a power semiconductor element comprising a power converter. However, in recent years, a SiC-MOSFET (metal oxide semiconductor field effect transistor) is actively applied as the power semiconductor element in order to achieve further size reduction and higher efficiency of the power converter.

In the event of an arm short circuit in the power converter, a high current flows through a power semiconductor element while a direct-current link voltage of the power converter being applied to the power semiconductor element. This may consequently cause a significantly large loss at the power semiconductor element, resulting in a thermal destruction of the power semiconductor element.

In order to ensure the reliability of the power converter, it is necessary to detect the short-circuit state of the power converter and protect the power converter. If the short-circuit withstanding capability remains the same, a higher current density of the power semiconductor element has a reduced amount of time for which the power semiconductor element can withstand the short-circuit state. Therefore, fast detection of short circuit is necessary. Furthermore, SiC-MOSFET is recently applied as the power semiconductor element, and there is an increased demand for fast short-circuit protection.

A most direct way known to detect the short-circuit state of the power converter is to detect the voltage across primary terminals. This method exploits the voltage across the primary terminals which is rendered a high voltage substantially equal to the direct-current link voltage when the power converter is subjected to the short-circuit state. However, it is necessary to set a detection period for distinguishing the short-circuit state from the normal state, and fast detection is therefore impossible.

For example, PTL 1 discloses a drive control circuit for power semiconductor element, which detects the gate voltage and the gate current of a power semiconductor element (IGBT). The drive control circuit integrates the detected gate current with respect to time to determine a gate charge amount. The drive control circuit detects an arm short-circuit if the gate voltage is higher than a predetermined reference voltage and the gate charge amount is lower than a predetermined reference gate charge amount.

CITATION LIST

Patent Literature

PTL 1: Japanese Patent Laying-Open No. 2015-53749 (on page 7, line 6 through page 10, line 41, FIG. 1)

SUMMARY OF INVENTION

Technical Problem

The gate drive circuit included in the power semiconductor element disclosed in PTL 1 detects the arm short circuit state by exploiting the relationship between the gate voltage and the gate charge amount, that is, the gate charge characteristics. Exploiting the gate charge characteristics allows fast detection of the arm short circuit state, without requiring to set the detection period.

However, since two signals, the gate voltage and the gate current or a voltage corresponding to the gate current, have to be detected, the circuit size is increased. In order to achieve a higher power density of the power converter, which is a recent trend, there is a demand for a reduced circuit size of the drive control circuit as much as possible.

Therefore, an object of the present disclosure is to provide a drive control circuit for power semiconductor element, a power semiconductor module, and a power converter, which have a reduced circuit size and allows fast detection of the short circuit.

Solution to Problem

A drive control circuit for power semiconductor element according to the present disclosure is a drive control circuit for a power semiconductor element having a control electrode, a positive-side electrode, and a negative-side electrode. The drive control circuit for the power semiconductor element includes: a driver to drive the power semiconductor element by transitioning a voltage applied between the control electrode and the negative-side electrode; a gate current detector to detect a gate current flowing between the driver and the control electrode; a gate charge amount calculator to calculate a gate charge amount to be supplied to the power semiconductor element, based on an amount of the gate current detected by the gate current detector; and a short-circuit detector to detect an arm short circuit or a load short circuit, based on a magnitude of the gate current and a magnitude of the gate charge amount. The short-circuit detector includes: a gate current determinator to compare the magnitude of the gate current with at least one reference value; a gate charge amount determinator to compare the magnitude of the gate charge amount with at least one reference value; and a short-circuit detection logical operation circuitry to execute a logical operation of an output signal of the gate current determinator and an output signal of the gate charge amount determinator.

Advantageous Effects of Invention

According to a drive control circuit for power semiconductor element of the present disclosure, the short-circuit detector includes: the gate current determinator that compares the magnitude of the gate current with at least one reference value; the gate charge amount determinator that compares the magnitude of the gate charge amount with at least one reference value; and the short-circuit detection logical operation circuitry that executes the logical operation of the output signal of the gate current determinator and the output signal of the gate charge amount determinator. This allows the drive control circuit to achieve fast detection of the short circuit with a small circuit size.

DESCRIPTION OF EMBODIMENTS

In the following, embodiments of the present disclosure are described, with reference to the accompanying drawings.

Embodiment 1

Figure 1:
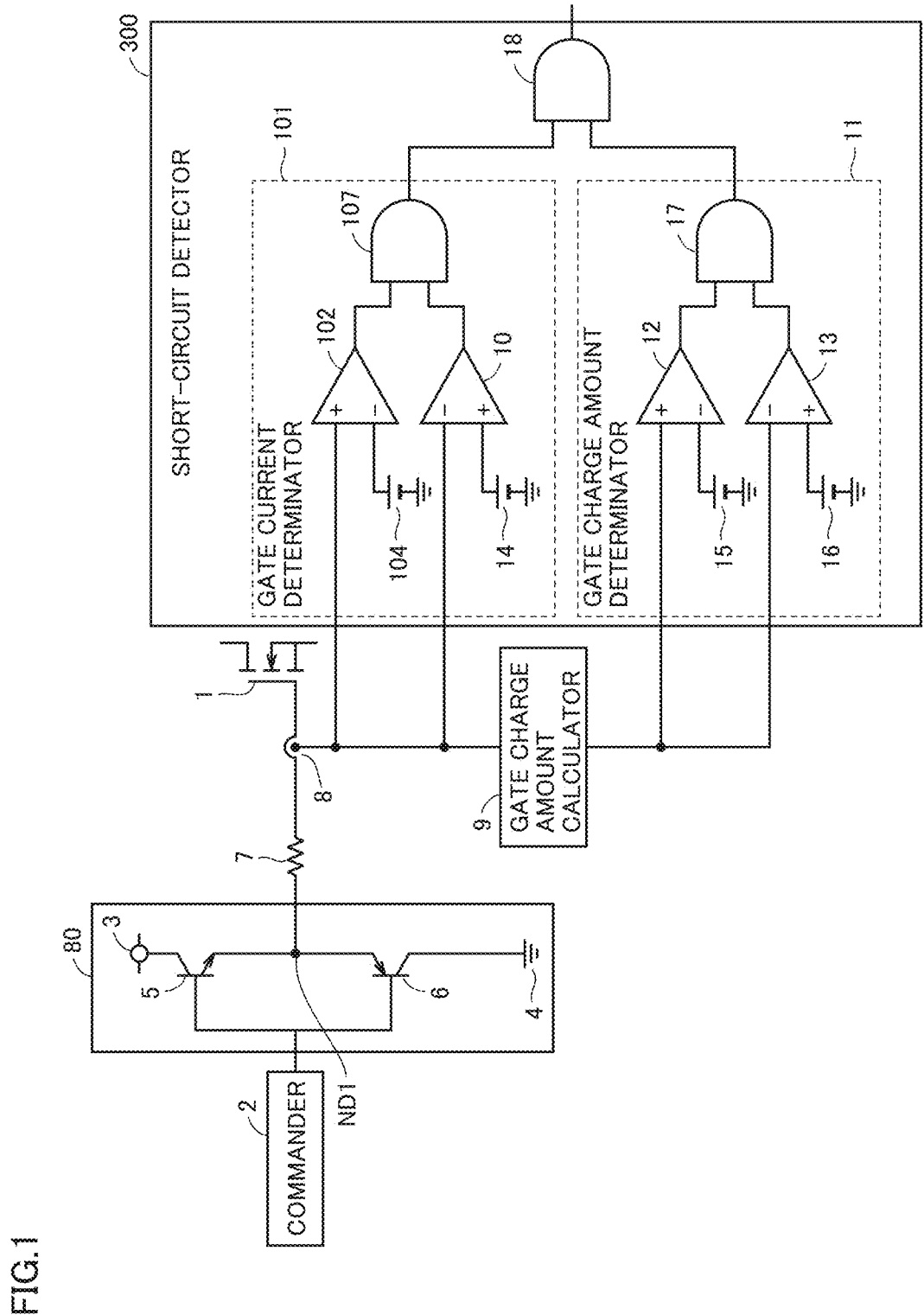
FIG. 1 is a diagram showing a drive control circuit for power semiconductor element, according to Embodiment 1.

FIG. 1 a diagram showing a drive control circuit for power semiconductor element, according to Embodiment 1.

The power semiconductor element 1 is any one of a Si-IGBT, a reverse conducting (RC)-IGBT, a SiC-MOSFET, a GaN transistor, and a Ga2O3 transistor. In the following description, the power semiconductor element 1 will be described with reference to a MOSFET. The power semiconductor element 1 has a control electrode, a positive-side electrode, and a negative-side electrode.

The drive control circuit for power semiconductor element includes: a commander 2; a driver 80; a resistor 7; a current sensor 8 functioning as a gate current detector; a gate charge amount calculator 9; and a short-circuit detector 300.

The commander 2 outputs to the driver 80 a command for turning on the power semiconductor element 1, or a command for turning off the power semiconductor element 1. The command for turning on the power semiconductor element 1 is a high-level signal. The command for turning off the power semiconductor element 1 is a low-level signal. Based on the signals from the commander 2, the power semiconductor element 1 transitions between a conductive (ON) state and a blocking (OFF) state.

The resistor 7 is disposed between the driver 80 and the power semiconductor element 1.

The driver 80 includes a transistor 5 and a transistor 6.

Upon receiving a command for turning on the power semiconductor element 1, the transistor 5 changes to the conductive state, and the transistor 6 changes to the blocking state. This connects a positive gate voltage source 3 to the control electrode of the power semiconductor element 1 via the resistor 7, thereby causing the power semiconductor element 1 to transition to the conductive state.

Upon receiving a command for turning off the power semiconductor element 1, the transistor 5 changes to the blocking state and the transistor 6 changes to the conductive state. This connects the reference potential 4 to the control electrode of the power semiconductor element 1 via the resistor 7, causing the power semiconductor element 1 to transition to the blocking state.

The current sensor 8 detects a gate current Ig flowing between the driver 80 and the control electrode of the power semiconductor element 1 when the power semiconductor element 1 is caused to transition to the conductive state (in a turn-on operation) and when the power semiconductor element 1 is caused to transition to the blocking state (in a turn-off operation). Specifically, the current sensor 8 detects the magnitude of a current flowing through a line between the driver 80 and the control electrode of the power semiconductor element 1. The current sensor 8 outputs a voltage signal indicative of the magnitude of the gate current Ig to the gate charge amount calculator 9 and a gate current determinator 101.

The gate charge amount calculator 9 receives the voltage signal indicative of the magnitude of the gate current Ig from the current sensor 8. The gate charge amount calculator 9 integrates the gate current, thereby calculating a gate charge amount Qg.

Based on the magnitude of the gate current Ig and the magnitude of the gate charge amount Qg, the short-circuit detector 300 detects an arm short circuit or a load short circuit. In the present embodiment, the short-circuit detector 300 detects an arm short circuit.

The short-circuit detector 300 includes a gate current determinator 101, a gate charge amount determinator 11, and an arm short circuit detection logical operation circuitry 18.

The gate current determinator 101 determines whether the gate current Ig is higher than or equal to a gate current lower limit reference value 104 and lower than or equal to a gate current upper limit reference value 14. The gate current determinator 101 outputs a high-level signal if the gate current Ig is higher than or equal to the gate current lower limit reference value 104 and lower than or equal to the gate current upper limit reference value 14.

The gate current determinator 101 includes a first comparator 102 for gate current, a second comparator 10 for gate current, and a logical operation circuitry 107 for gate current.

The first comparator 102 for gate current compares the output signal of the current sensor 8 with the gate current lower limit reference value 104. The first comparator 102 for gate current outputs a high-level signal if the output signal of the current sensor 8 is higher than or equal to the gate current lower limit reference value 104.

The second comparator 10 for gate current compares the output signal of the current sensor 8 with the gate current upper limit reference value 14. The second comparator 10 for gate current outputs a high-level signal if the output signal of the current sensor 8 is lower than or equal to the gate current upper limit reference value 14.

The logical operation circuitry 107 for gate current outputs a logical AND of the output signal of the second comparator 10 for gate current and the output signal of the first comparator 102 for gate current.

The gate charge amount determinator 11 determines whether the gate charge amount Qg is higher than or equal to the gate charge amount lower limit reference value 15 and lower than or equal to the gate charge amount upper limit reference value 16. The gate charge amount determinator 11 outputs a high-level signal if the gate charge amount Qg is higher than or equal to the gate charge amount lower limit reference value 15 and lower than or equal to the gate charge amount upper limit reference value 16. The gate charge amount determinator 11 includes a first comparator 12 for gate charge amount, a second comparator 13 for gate charge amount, and a logical operation circuitry 17 for gate charge amount.

The first comparator 12 for gate charge amount compares the output signal (the gate charge amount Qg) of the gate charge amount calculator 9 with the gate charge amount lower limit reference value 15. The first comparator 12 for gate charge amount outputs a high-level signal if the output signal (the gate charge amount Qg) of the gate charge amount calculator 9 is higher than or equal to the gate charge amount lower limit reference value 15.

The second comparator 13 for gate charge amount compares the output signal (the gate charge amount Qg) of the gate charge amount calculator 9 with the gate charge amount upper limit reference value 16. The second comparator 13 for gate charge amount outputs a high-level signal if the output signal (the gate charge amount Qg) of the gate charge amount calculator 9 is lower than or equal to the gate charge amount upper limit reference value 16.

The logical operation circuitry 17 for gate charge amount outputs a logical AND of the output signal of the first comparator 12a for gate charge amount and the output signal of the second comparator 13 for gate charge amount.

The arm short circuit detection logical operation circuitry 18 determines a logical AND of the output signal of the logical operation circuitry 107 for gate current of the gate current determinator 101 and the output signal of the logical operation circuitry 17 for gate charge amount of the gate charge amount determinator 11, thereby detecting the arm short circuit. Only if the output signal of the logical operation circuitry 107 for gate current is at a high level and the output signal of the logical operation circuitry 17a for gate charge amount is at a high level, the arm short circuit detection logical operation circuitry 18 determines that the power semiconductor element 1 is in the arm short circuit state and outputs a high-level signal indicating that the power semiconductor element 1 is in the arm short circuit state.

A method of detection of the arm short circuit, according to the present embodiment, is now described.

Figure 2:
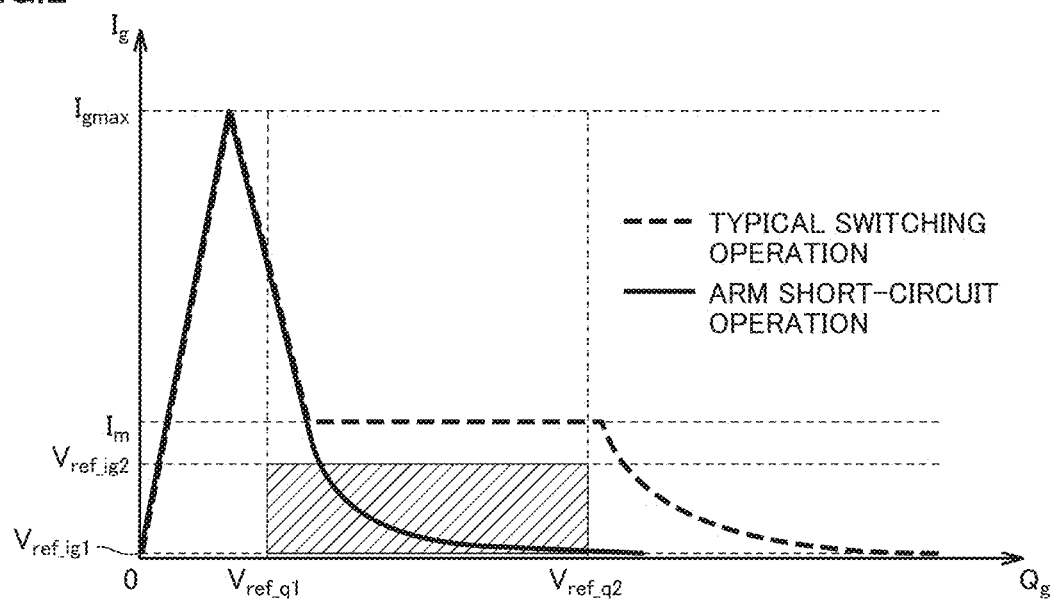
FIG. 2 is a diagram for illustrating a principle of detection of an arm short circuit based on the relationship between a gate current Ig and a gate charge amount Qg.

FIG. 2 is a diagram for illustrating a principle of detection of the arm short circuit based on the relationship between the gate current Ig and the gate charge amount Qg. In the arm short circuit, the power semiconductor element 1 and the power semiconductor element of another arm operating complementary to the power semiconductor element 1 are simultaneously on.

The waveform in dotted line (partially overlapping the solid line) indicates the gate current Ig versus the gate charge amount Qg in a typical switching operation. The waveform in solid line indicates the gate current Ig versus the gate charge amount Qg in the arm short circuit operation.

In the typical turn-on operation, the gate current Ig increases to the peak value (Igmax) over time, and then decreases. Subsequently, the gate current Ig undergoes a period (a mirror period) during which the gate current Ig is at a constant current value (Im) and then decreases again. In the arm short-circuit operation, in contrast, the gate current Ig reaches the peak value (Igmax), and thereafter monotonically decreases, without undergoing the period (the mirror period) during which the gate current Ig is at a constant value.

As such, the typical turn-on operation and the arm short circuit operation are apparently different on the relationship between the gate current Ig and the gate charge amount Qg. The drive control circuit for power semiconductor element according to the present embodiment exploits such a difference to detect the arm short circuit state.

The gate current upper limit reference value 14 is set to a value (Vref_ig2) lower than the gate current value (Im) during the mirror period in the typical switching operation. The gate current lower limit reference value 104 is set to a value (Vref_ig1) higher than zero.

The gate charge amount lower limit reference value 15 is set to a value (Vref_q1) higher than the gate charge amount where the gate current is at the peak value (Igmax) in the typical switching operation. The gate charge amount upper limit reference value 16 is set to a value (Vref_q2) lower than the gate charge amount at the end of the mirror period in the typical switching operation.

Having set the reference values as such, the arm short circuit state can be detected if the gate current Ig is in a range of Vref_ig1≤Ig≤Vref_ig2 and the gate charge amount Qg is in a range of Vref_q1≤Qg≤Vref_q2 (the hatched area of FIG. 2).

The gate current determinator 101 operates as follows:

The first comparator 102 for gate current outputs a high-level signal if the output signal of the current sensor 8 is higher than or equal to the gate current lower limit reference value 104 (=Vref_ig1). The second comparator 10 for gate current outputs a high-level signal if the output signal of the current sensor 8 is lower than or equal to the gate current upper limit reference value 14 (=Vref_ig2). In order to output a logical AND of the output signal of the first comparator 102 for gate current and the output signal of the second comparator 10 for gate current, the logical operation circuitry 107 outputs a high-level signal if the output signal of the current sensor 8 is higher than or equal to the gate current lower limit reference value 104 (=Vref_ig1) and lower than or equal to the gate current upper limit reference value 14 (=Vref_ig2).

The gate charge amount determinator 11 operates as follows:

The first comparator 12 for gate charge amount outputs a high-level signal if the output signal of the gate charge amount calculator 9 is higher than or equal to the gate charge amount lower limit reference value 15 (=Vref_q1). The second comparator 13 for gate charge amount outputs a high-level signal if the output signal of the gate charge amount calculator 9 is lower than or equal to the gate charge amount upper limit reference value 16 (=Vref_q2). In order to output the logical AND of the output signal of the first comparator 12a for gate charge amount and the output signal of the second comparator 13 for gate charge amount, the logical operation circuitry 17 outputs a high-level signal if the output signal of the gate charge amount calculator 9 is higher than or equal to the gate charge amount lower limit reference value 15 (=Vref_q1) and lower than or equal to the gate charge amount upper limit reference value 16 (=Vref_q2).

The arm short-circuit detection logical operation circuitry 18 outputs a high-level signal if the gate current Ig is higher than or equal to the gate current lower limit reference value 104 (=Vref_ig1) and lower than or equal to the gate current upper limit reference value 14 (=Vref_ig2) and the gate charge amount Qg is higher than or equal to the gate charge amount lower limit reference value 15 (=Vref_q1) and lower than or equal to the gate charge amount upper limit reference value 16 (=Vref_q2).

As described above, the drive control circuit for power semiconductor element according to the present embodiment outputs a high-level signal if the power semiconductor element 1 is in the arm short circuit state.

The drive control circuit for power semiconductor element according to the present embodiment can promptly detect the arm short circuit and protect the power converter, without having to set a detection period for determining the short-circuit state. Furthermore, the drive control circuit for power semiconductor element according to the present embodiment is highly reliable, inexpensive, and has a reduced circuit size.

Embodiment 2

Figure 3:
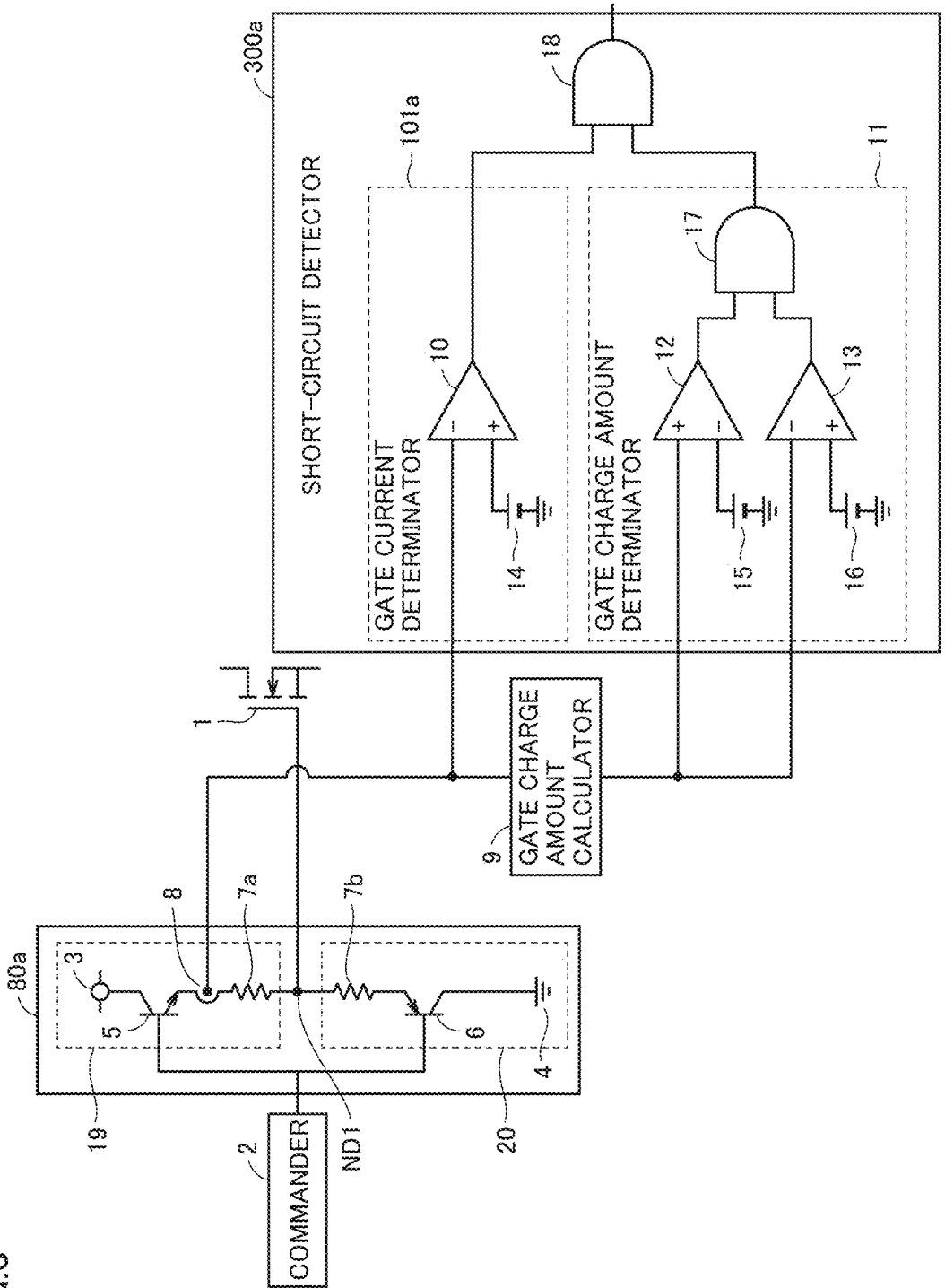
FIG. 3 is a diagram showing a drive control circuit for power semiconductor element, according to Embodiment 2.

A method of detection of gate current according to the present embodiment differs from the method of detection of the gate current according to Embodiment 1. FIG. 3 is a diagram showing a drive control circuit for power semiconductor element, according to Embodiment 2. The drive control circuit for power semiconductor element according to Embodiment 2 of FIG. 3 differs from the power semiconductor element 1 according to Embodiment 1 of FIG. 1 in that the drive control circuit for power semiconductor element according to Embodiment 2 includes a driver 80a, instead of the driver 80, and a short-circuit detector 300a instead of the short-circuit detector 300.

The short-circuit detector 300a includes a gate charge amount determinator 11 similar to that in Embodiment 1, and a gate current determinator 101a, instead of the gate current determinator 101.

The driver 80a includes an on-switch circuit 19 and an off-switch circuit 20.

The on-switch circuit 19 includes a positive gate voltage source 3, a transistor 5, and an on-gate resistor 7a. The off-switch circuit 20 includes a reference potential 4, a transistor 6, and an off-gate resistor 7b. The positive gate voltage source 3, the transistor 5, the on-gate resistor 7a, the off-gate resistor 7b, the transistor 6, and the reference potential 4 are connected in series.

A control electrode of the power semiconductor element 1 connects to a node ND1 connected to the on-gate resistor 7a and the off-gate resistor 7b.

The current sensor 8 detects the current flowing from the transistor 5 to the on-gate resistor 7a. The current sensor 8 detects the gate current flowing into the control electrode of the power semiconductor element 1 when the power semiconductor element 1 is caused to transition to the conductive state (in the turn-on operation). The current sensor 8 sends a voltage signal indicative of a result of the detection to the gate charge amount calculator 9 and the gate current determinator 101a.

In Embodiment 1, since the current sensor 8 detects the current between the node ND1 and the power semiconductor element 1, the current sensor 8 detects the gate current in both the turn-on operation and the turn-off operation.

In Embodiment 2, since the current sensor 8 detects the current flowing through the on-switch circuit 19, the current sensor 8 detects the gate current flowing into the control electrode of the power semiconductor element 1, only in the turn-on operation.

In Embodiment 1, since the current sensor 8 detects the gate current even in the turn-off operation, the arm short circuit detection logical operation circuitry 18 may detect the arm short circuit even in the turn-off operation. In Embodiment 2, in contrast, the current sensor 8 detects the gate current only in the turn-on operation, and the chances of false detection are thereby eliminated.

The gate current determinator 101a determines whether a gate current Ig is lower than or equal to the gate current upper limit reference value 14. If the gate current Ig is lower than or equal to the gate current upper limit reference value 14, the gate current determinator 101a outputs a high-level signal.

The gate current determinator 101a includes a second comparator 10 for gate current. The second comparator 10 for gate current compares the output signal of the current sensor 8 with a gate current upper limit reference value 14. The second comparator 10 for gate current outputs a high-level signal if the output signal of the current sensor 8 is lower than or equal to the gate current upper limit reference value 14.

In the present embodiment, the gate current Ig detected by the current sensor 8 is only a positive value, as described above. Since there is no need to detect whether the gate current Ig is higher than zero, the gate current determinator 101a includes only the second comparator 10 for gate current.

The arm short circuit detection logical operation circuitry 18 determines a logical AND of the output signal of the second comparator 10 for gate current of the gate current determinator 101a and the output signal of the logical operation circuitry 17 for gate charge amount of the gate charge amount determinator 11, thereby detecting the arm short circuit. The arm short circuit detection logical operation circuitry 18 detects that the power semiconductor element 1 is in the arm short circuit state and outputs a high-level signal indicating that the power semiconductor element 1 is in the arm short circuit state, only if the output signal of the second comparator 10 for gate current is a high-level signal and the output signal of the logical operation circuitry 17 for gate charge amount is a high-level signal.

While FIG. 3 shows the configuration in which no resistor is connected between the control electrode of the power semiconductor element 1 and the node ND1 connected to the on-gate resistor 7a and the off-gate resistor 7b, a resistor may be connected between the node ND1 and the control electrode of the power semiconductor element 1.

Embodiment 3

Figure 4:
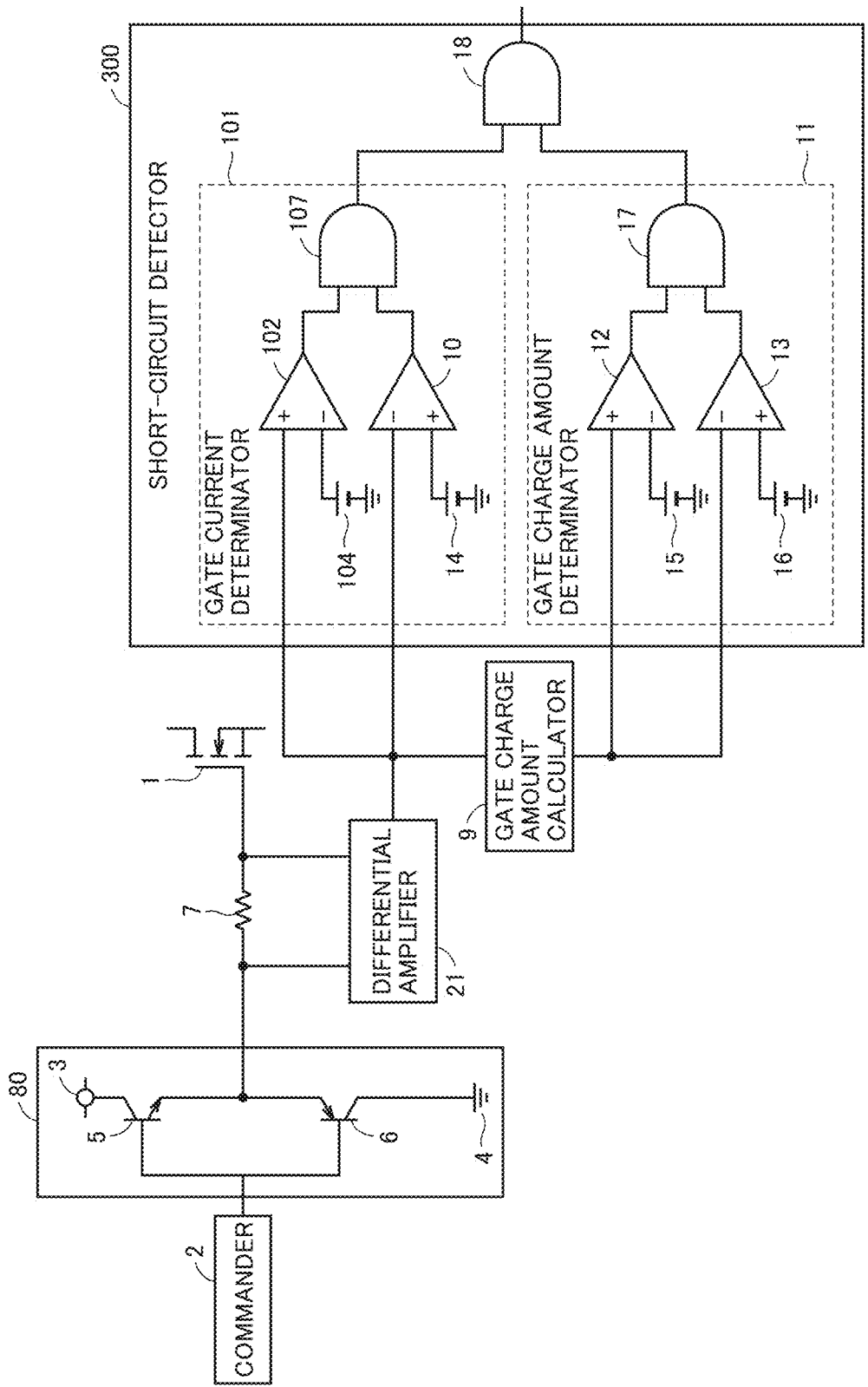
FIG. 4 is a diagram showing a drive control circuit for power semiconductor element, according to Embodiment 3.

A method of detection of gate current according to the present embodiment differs from the method of detection of gate current according to Embodiment 1. FIG. 4 is a diagram showing a drive control circuit for power semiconductor element, according to Embodiment 3. The drive control circuit for power semiconductor element according to Embodiment 3 of FIG. 4 differs from the power semiconductor element 1 according to Embodiment 1 of FIG. 1 in that the drive control circuit for power semiconductor element according to Embodiment 3 includes a differential amplifier 21, instead of the current sensor 8.

The differential amplifier 21 detects a voltage across a resistor 7, thereby detecting a gate current Ig flowing between a driver 80 and a control electrode of the power semiconductor element 1. The output signal of the differential amplifier 21 is sent to a gate charge amount calculator 9 and a gate current determinator 101.

The gate charge amount calculator 9 receives a voltage signal indicative of the magnitude of the gate current Ig from the differential amplifier 21. The gate charge amount calculator 9 integrates the gate current Ig, thereby calculating a gate charge amount Qg.

The first comparator 102 for gate current compares the output signal of the differential amplifier 21 with a gate current lower limit reference value 104. The first comparator 102 for gate current outputs a high-level signal if the output signal of the differential amplifier 21 is higher than or equal to the gate current lower limit reference value 104.

The second comparator 10 for gate current compares the output signal of the differential amplifier 21 with a gate current upper limit reference value 14. The second comparator 10 for gate current outputs a high-level signal if the output signal of the differential amplifier 21 is lower than or equal to the gate current upper limit reference value 14.

Other operations are similar to those in Embodiment 1.

Embodiment 4

Figure 5:
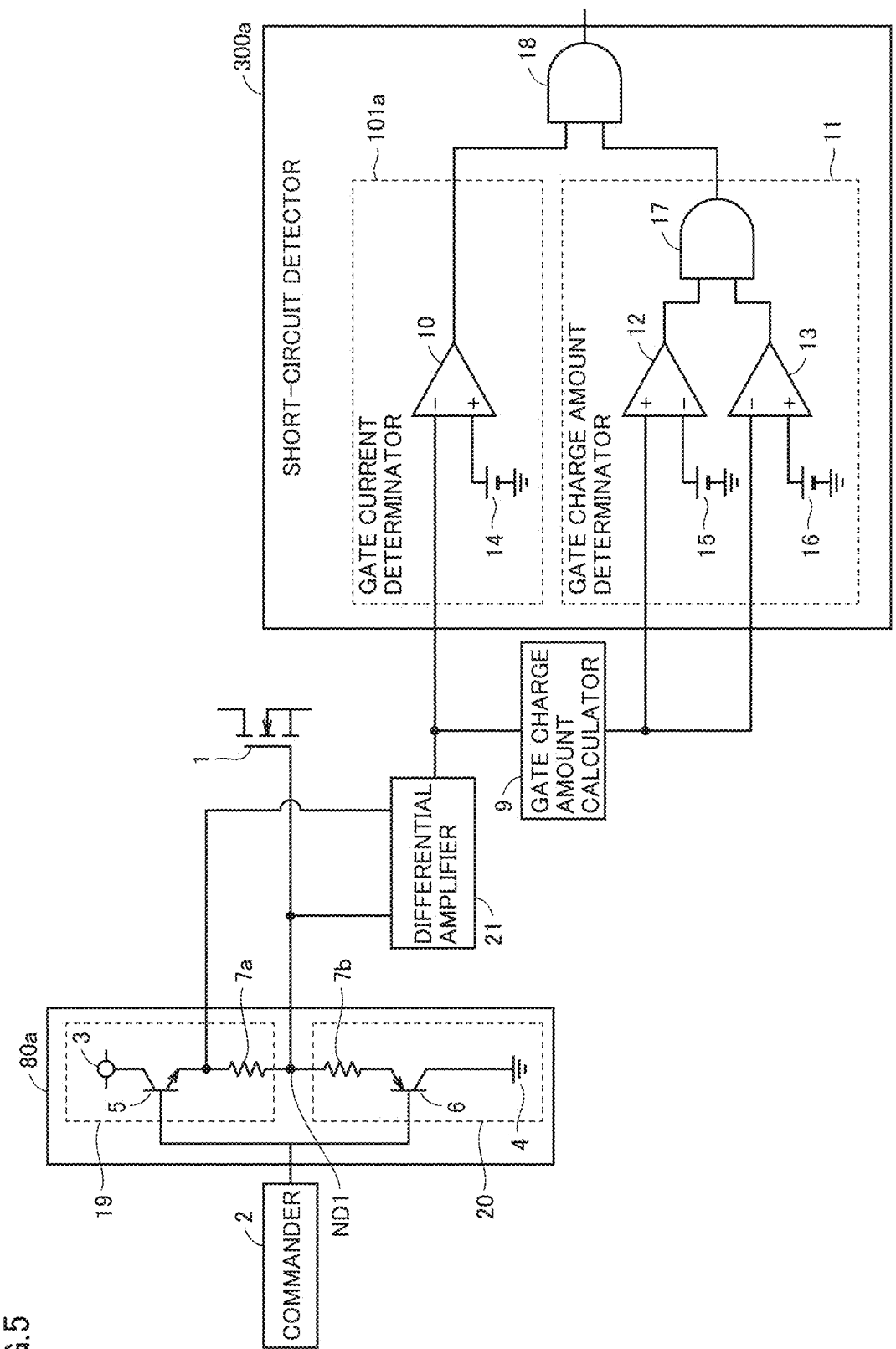
FIG. 5 is a diagram showing a drive control circuit for power semiconductor element, according to Embodiment 4.

FIG. 5 is a diagram showing a drive control circuit for power semiconductor element, according to Embodiment 4. The drive control circuit for power semiconductor element according to Embodiment 4 of FIG. 5 differs from the power semiconductor element 1 according to Embodiment 2 of FIG. 3 in that the drive control circuit for power semiconductor element according to Embodiment 4 includes a differential amplifier 21, instead of the current sensor 8.

The differential amplifier 21 detects the voltage across an on-gate resistor 7a, thereby detecting a gate current Ig flowing into a control electrode of the power semiconductor element 1. The output signal of the differential amplifier 21 is sent to a gate charge amount calculator 9 and a gate current determinator 101. The subsequent operations are similar to those in Embodiment 1.

Embodiment 5

Figure 6:
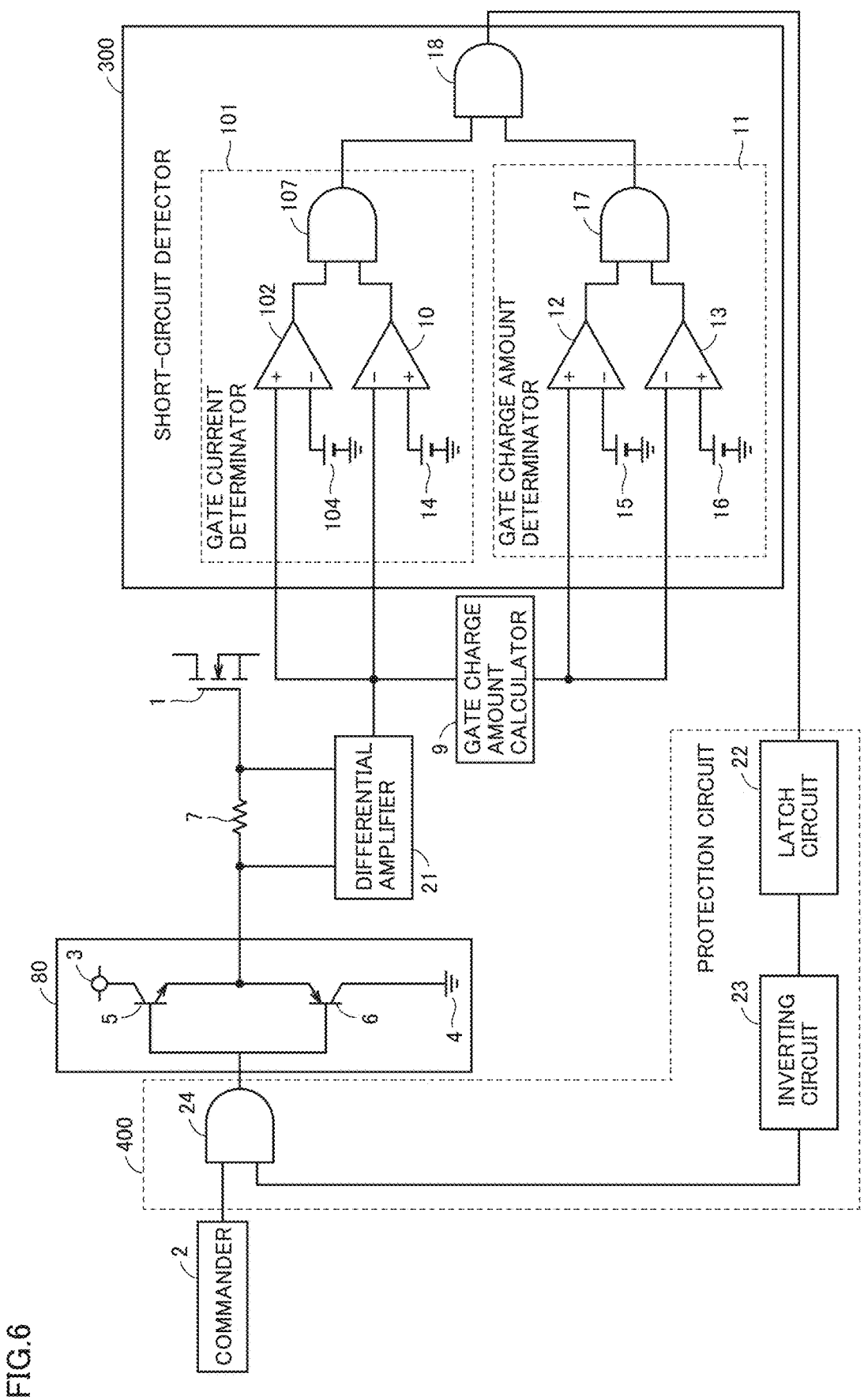
FIG. 6 is a diagram showing a drive control circuit for power semiconductor element, according to Embodiment 5.

FIG. 6 is a diagram showing a drive control circuit for power semiconductor element, according to Embodiment 5. The drive control circuit for power semiconductor element according to Embodiment 5 of FIG. 6 differs from the power semiconductor element 1 according to Embodiment 3 of FIG. 4 in that the drive control circuit for power semiconductor element according to Embodiment 5 includes a protection circuit 400.

If the short-circuit detector 300 detects arm short circuit or a load short circuit, the protection circuit 400 outputs a command for causing a driver 80 to turn off the power semiconductor element 1, irrespective of a command from the commander 2.

The protection circuit 400 includes a latch circuit 22, an inverting circuit 23, and a logical operation circuitry 24.

As the output signal of arm short circuit detection logical operation circuitry 18 changes from a low-level signal to a high-level signal, the latch circuit 22 holds the high-level signal. The held output signal is sent to the inverting circuit 23. The inverting circuit 23 inverts the level of the output signal of the latch circuit 22.

The logical operation circuitry 24 outputs a logical AND of the output signal of the commander 2 and the output signal of the inverting circuit 23 to the driver 80. This causes the transistor 5 and the transistor 6 to control the power semiconductor element 1 so that the power semiconductor element 1 is brought into the conductive state or the blocking state.

In a typical operation, the arm short circuit detection logical operation circuitry 18 outputs a low-level signal. At this time, the latch circuit 22 outputs a low-level signal to the inverting circuit 23. The inverting circuit 23 outputs a high-level signal. Since the output signal of the inverting circuit 23 is a high-level signal, the logical operation circuitry 24 outputs a high-level signal to the driver 80 if the signal from the commander 2 is a high-level signal. As a result, the transistor 5 is turned on and the transistor 6 is turned off in the driver 80, thereby bringing the power semiconductor element 1 into the conductive state.

The arm short circuit detection logical operation circuitry 18 outputs a high-level signal if the arm short circuit detection logical operation circuitry 18 detects the arm short circuit. The latch circuit 22 holds the high-level output signal output from the arm short circuit detection logical operation circuitry 18, and outputs it to the inverting circuit 23. The inverting circuit 23 outputs a low-level signal. Since the output signal of the inverting circuit 23 is a low-level signal, the logical operation circuitry 24 outputs a low-level signal to the driver 80, irrespective of the level of the signal from the commander 2. As a result, the transistor 5 is turned off and the transistor 6 is turned on in the driver 80, thereby bringing the power semiconductor element 1 into the blocking state. This protects the power semiconductor element 1.

In Embodiment 5, an electrical quantity corresponding to the gate current of the power semiconductor element 1 is detected by the differential amplifier 21 detecting the voltage across the resistor 7 connected to the control electrode of the power semiconductor element 1, as with Embodiment 3. However, the present embodiment is not limited thereto. As with Embodiments 1 and 2, the current sensor 8 may detect the electrical quantity corresponding to the gate current. Alternatively, the electrical quantity corresponding to the gate current of the power semiconductor element 1 may be detected by detecting the voltage across the on-gate resistor 7a, as with Embodiment 4.

Embodiment 6

Figure 7:
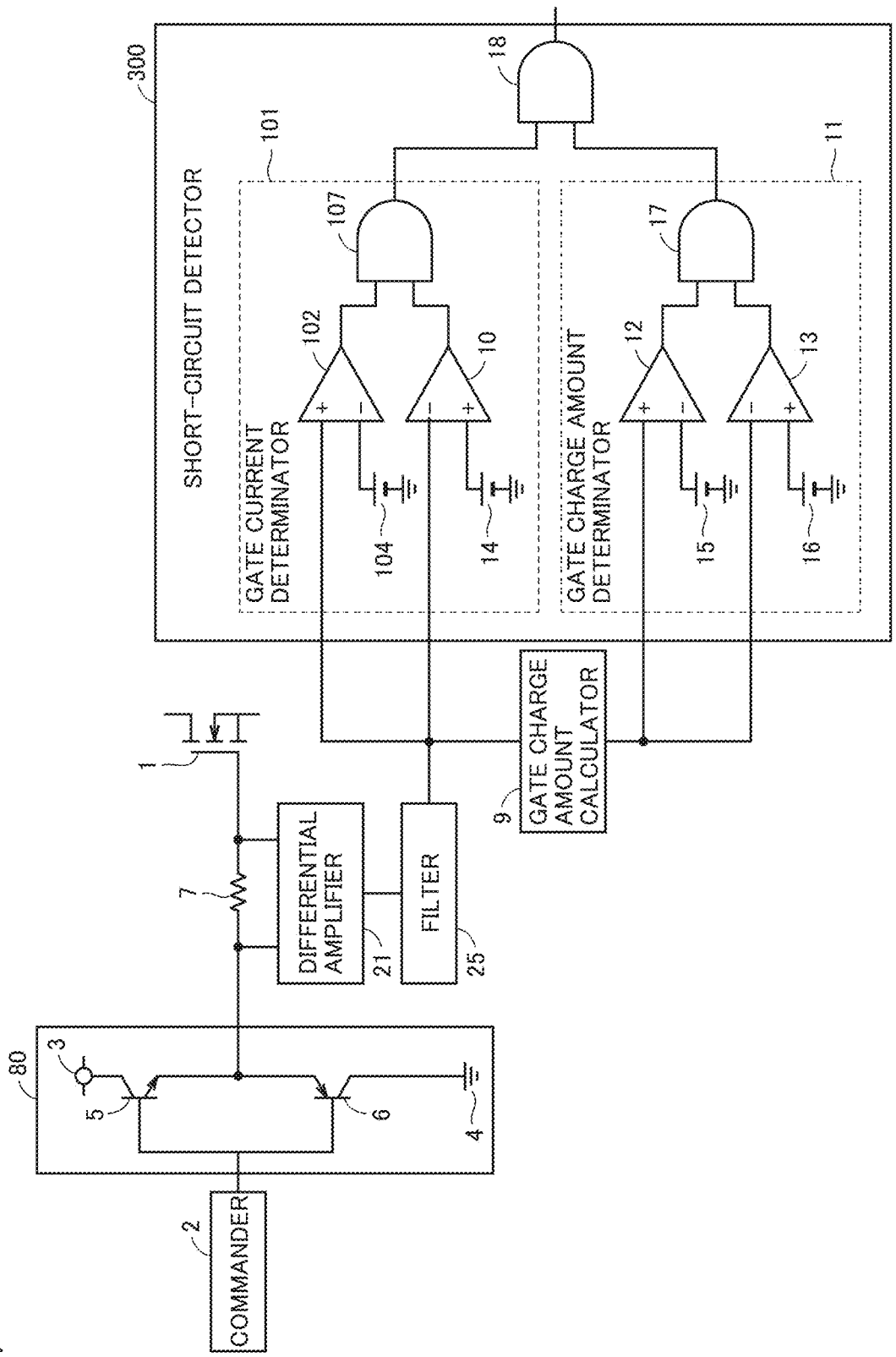
FIG. 7 is a diagram showing a drive control circuit for power semiconductor element, according to Embodiment 6.

FIG. 7 is a diagram showing a drive control circuit for power semiconductor element, according to Embodiment 6. The drive control circuit for power semiconductor element according to Embodiment 6 of FIG. 7 differs from the power semiconductor element 1 according to Embodiment 3 of FIG. 4 in that the drive control circuit for power semiconductor element according to Embodiment 6 includes a filter 25.

The filter 25 receives the output signal of a differential amplifier 21. The filter 25 reshapes the waveform of the output signal of the differential amplifier 21 with a predetermined time constant. Since the filter 25 allows moderate changes in output signal of the differential amplifier 21 over time, false detection of the arm short circuit can be prevented. The output of the filter 25 is sent to a gate charge amount calculator 9, a short-circuit detector 300, a first comparator 102 for gate current, and a second comparator 10 for gate current.

Other operations of the present embodiment are similar to those in Embodiment 3.

In the present embodiment, the electrical quantity corresponding to the gate current of the power semiconductor element 1 is detected by the differential amplifier 21 detecting the voltage across the resistor 7 connected to the control electrode of the power semiconductor element 1, as with Embodiment 3. However, the present embodiment is not limited thereto. The current sensor 8 may detect the electrical quantity corresponding to the gate current, as with Embodiments 1 and 2. Alternatively, the electrical quantity corresponding to the gate current of the power semiconductor element 1 may be detected by detecting the voltage across an on-gate resistor 7a, as with Embodiment 4. The protection circuit 400 may cause the power semiconductor element 1 to transition to the blocking state if the arm short circuit state is detected, as with Embodiment 5.

Embodiment 7

Figure 8:
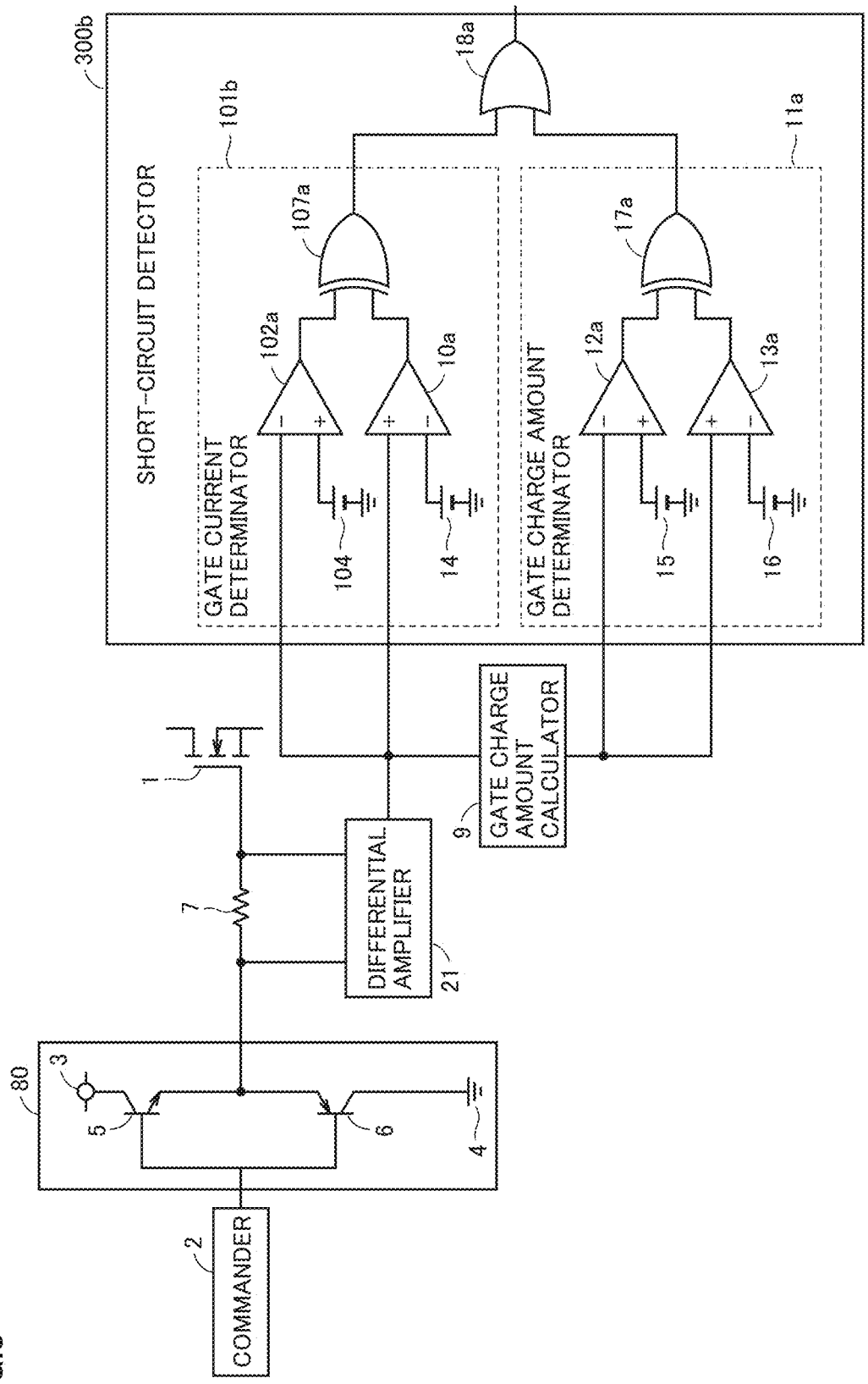
FIG. 8 is a diagram showing a drive control circuit for power semiconductor element, according to Embodiment 7.

FIG. 8 is a diagram showing a drive control circuit for power semiconductor element, according to Embodiment 7. The drive control circuit for power semiconductor element according to Embodiment 7 of FIG. 8 differs from the power semiconductor element 1 according to Embodiment 3 of FIG. 4 in that the drive control circuit for power semiconductor element according to Embodiment 7 includes a short-circuit detector 300b, instead of the short-circuit detector 300.

The short-circuit detector 300b includes a gate current determinator 101b, instead of the gate current determinator 101, a gate charge amount determinator 11a, instead of the gate charge amount determinator 11, and an arm short circuit detection logical operation circuitry 18a, instead of the arm short circuit detection logical operation circuitry 18.

The gate current determinator 101b determines whether a gate current Ig is higher than or equal to a gate current lower limit reference value 104 and lower than or equal to a gate current upper limit reference value 14. The gate current determinator 101b outputs a low-level signal if the gate current Ig is higher than or equal to the gate current lower limit reference value 104 and lower than or equal to the gate current upper limit reference value 14.

The gate current determinator 101b includes a first comparator 102a for gate current, a second comparator 10a for gate current, and a logical operation circuitry 107a for gate current.

The first comparator 102a for gate current compares the output signal of a differential amplifier 21 with the gate current lower limit reference value 104. The first comparator 102a for gate current outputs a low-level signal if the output signal of the differential amplifier 21 is higher than or equal to the gate current lower limit reference value 104.

The second comparator 10a for gate current compares the output signal of the differential amplifier 21 with the gate current upper limit reference value 14. The second comparator 10a for gate current outputs a low-level signal if the output signal of the differential amplifier 21 is lower than or equal to the gate current upper limit reference value 14.

The logical operation circuitry 107a for gate current performs an XOR operation that compares the output signal of the first comparator 102a for gate current and the output signal of the second comparator 10a for gate current. The logical operation circuitry 107a for gate current outputs a low-level signal if the output signal of the first comparator 102a for gate current is a low-level signal and the output signal of the second comparator 10a for gate current is a low-level signal. Considering the fact that there is no chance of the output signal of the first comparator 102a for gate current being a high-level signal and the output signal of the second comparator 10a for gate current being a high-level signal at the same time, the logical operation circuitry 107a for gate current is the XOR operation circuitry. However, the logical operation circuitry 107a for gate current may be an OR operation circuitry.

The gate charge amount determinator 11a determines whether a gate charge amount Qg is higher than or equal to a gate charge amount lower limit reference value 15 and lower than or equal to a gate charge amount upper limit reference value 16. The gate charge amount determinator 11a outputs a low-level signal if the gate charge amount Qg is higher than or equal to the gate charge amount lower limit reference value 15 and lower than or equal to the gate charge amount upper limit reference value 16.

The gate charge amount determinator 11a includes a first comparator 12a for gate charge amount, a second comparator 13a for gate charge amount, and a logical operation circuitry 17a for gate charge amount.

The first comparator 12a for gate charge amount compares the output signal of a gate charge amount calculator 9 with the gate charge amount lower limit reference value 15. The first comparator 12a for gate charge amount outputs a low-level signal if the output signal of the gate charge amount calculator 9 is higher than or equal to the gate charge amount lower limit reference value 15.

The second comparator 13a for gate charge amount compares the output signal of the gate charge amount calculator 9 with the gate charge amount upper limit reference value 16. The second comparator 13a for gate charge amount outputs a low-level signal if the output signal of the gate charge amount calculator 9 is lower than or equal to the gate charge amount upper limit reference value 16.

The logical operation circuitry 17a for gate charge amount performs an XOR operation that compares the output signal of the first comparator 12 for gate charge amount and the output signal of the second comparator 13 for gate charge amount. The logical operation circuitry 17a outputs a low-level signal if the output signal of the first comparator 12a for gate charge amount is a low-level signal and the output signal of the second comparator 13a for gate charge amount is a low-level signal. Considering the fact that there is no chance of the output signal of the first comparator 12b for gate charge amount being a high-level signal and the output signal of the second comparator 13b for gate charge amount being a high-level signal at the same time, the logical operation circuitry 17a for gate charge amount is the XOR operation circuitry. However, the logical operation circuitry 17a for gate charge amount may be an OR operation circuitry.

Based on the OR operation of the output signal of the gate current determinator 101 and the output signal of the gate charge amount determinator 11, the arm short circuit detection logical operation circuitry 18a detects an arm short circuit. The arm short circuit detection logical operation circuitry 18a detects the arm short circuit and outputs a low-level signal indicating the occurrence of the arm short circuit only if the output signal of the gate current determinator 101b is a low-level signal (the gate current Ig is lower than or equal to the gate current upper limit reference value 14 and higher than or equal to the gate current lower limit reference value 104) and the output signal of the gate charge amount determinator 11a is a low-level signal (the gate charge Qg is higher than or equal to the gate charge amount lower limit reference value 15 and lower than or equal to the gate charge amount upper limit reference value 16).

In the present embodiment, the electrical quantity corresponding to the gate current of the power semiconductor element 1 is detected by the differential amplifier 21 detecting the voltage across the resistor 7 connected to the control electrode of the power semiconductor element 1, as with Embodiment 3. However, the present embodiment is not limited thereto. As with Embodiments 1 and 2, the current sensor 8 may detect the electrical quantity corresponding to the gate current. Alternatively, the electrical quantity corresponding to the gate current of the power semiconductor element 1 may be detected by detecting the voltage across the on-gate resistor 7a, as with Embodiment 4. As with Embodiment 5, the protection circuit 400 may cause the power semiconductor element 1 to transition to the blocking state if the arm short circuit state is detected.

Embodiment 8

Figure 9:
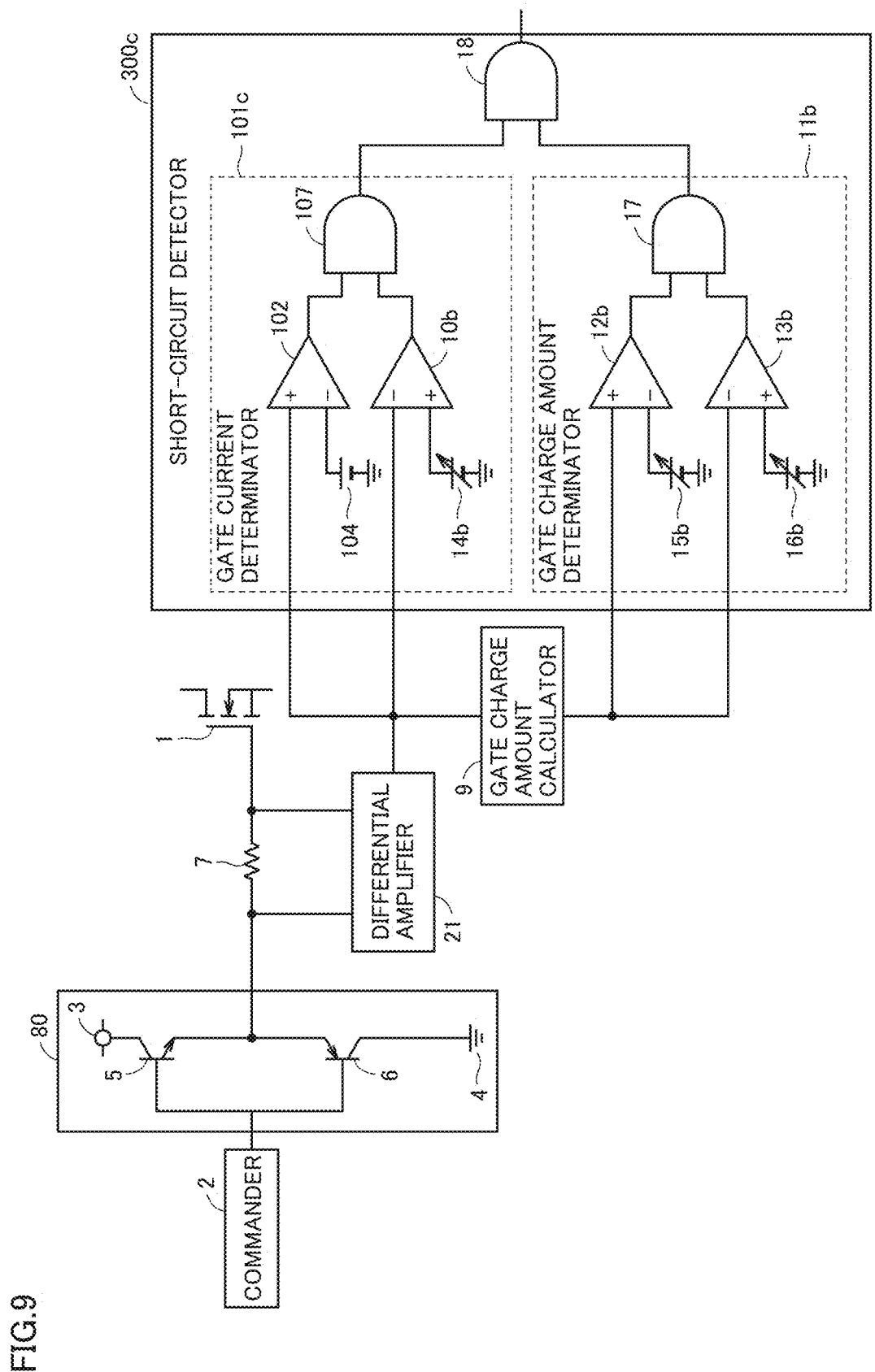
FIG. 9 is a diagram showing a drive control circuit for power semiconductor element, according to Embodiment 8.

FIG. 9 is a diagram showing a drive control circuit for power semiconductor element, according to Embodiment 8. The drive control circuit for power semiconductor element according to Embodiment 8 of FIG. 9 differs from the power semiconductor element 1 according to Embodiment 3 of FIG. 4 in that the drive control circuit for power semiconductor element according to Embodiment 8 includes a short-circuit detector 300c, instead of the short-circuit detector 300.

The short-circuit detector 300c includes a gate current determinator 101c, instead of the gate current determinator 101, and a gate charge amount determinator 11b, instead of the gate charge amount determinator 11.

The gate current determinator 101c differs from the gate current determinator 101 in that the gate current determinator 101c includes a second comparator 10b for gate current, instead of the second comparator 10 for gate current.

The second comparator 10b for gate current compares the output signal of a differential amplifier 21 with a variable gate current upper limit reference value 14b. The second comparator 10b for gate current outputs a high-level signal if the output signal of the differential amplifier 21 is lower than or equal to the variable gate current upper limit reference value 14b.

In Embodiment 1, the gate current upper limit reference value 14 is set to a value (Vref_ig2) lower than the gate current value (Im) during the mirror period. The gate current value Im during the mirror period depends on the output characteristics of the power semiconductor element 1 and the resistance between the positive gate voltage source 3 and the control electrode of the power semiconductor element 1. The output characteristics of the power semiconductor element 1 are temperature dependent. Thus, the gate current value Im during the mirror period is temperature dependent. In the present embodiment, the gate current upper limit reference value 14b is set so as to vary in response to the temperature. As a result, the gate current upper limit reference value 14b can be set to an appropriate value in accordance with the operating environment of the power semiconductor element 1, thereby ensuring the detection of the arm short circuit state.

The gate charge amount determinator 11b differs from the gate charge amount determinator 11 in that the gate charge amount determinator 11b includes a first comparator 12b for gate charge amount, instead of the first comparator 12 for gate charge amount, and a second comparator 13b for gate charge amount, instead of the second comparator 13 for gate charge amount.

The first comparator 12b for gate charge amount compares the output signal (a gate charge amount Qg) of a gate charge amount calculator 9 with a variable gate charge amount lower limit reference value 15b. The first comparator 12b for gate charge amount outputs a high-level signal if the output signal (the gate charge amount Qg) of the gate charge amount calculator 9 is higher than or equal to the variable gate charge amount lower limit reference value 15b.

The second comparator 13b for gate charge amount compares the output signal (the gate charge amount Qg) of the gate charge amount calculator 9 with a variable gate charge amount upper limit reference value 16b. The second comparator 13 for gate charge amount outputs a high-level signal if the output signal (the gate charge amount Qg) of the gate charge amount calculator 9 is lower than or equal to the variable gate charge amount upper limit reference value 16b.

In Embodiment 1, the gate charge amount lower limit reference value 15 is set to a value (Vref_q1) higher than the charge amount where the gate current is at the peak value (Igmax). The gate charge amount upper limit reference value 16 is set to a value (Vref_q2) lower than the gate charge amount at the end of the mirror period.

A gate current Ig during the mirror period flows through a feedback capacitance of the power semiconductor element 1. The feedback capacitance is the parasitic capacitance between the positive-side electrode and the control electrode of the power semiconductor element 1. The charge amount supplied to the power semiconductor element 1 during the mirror period is dependent on the voltage applied between the positive-side electrode and the negative-side electrode of the power semiconductor element 1.

In the present embodiment, the gate charge amount lower limit reference value 15b and the gate charge amount upper limit reference value 16b are set so that they vary in response to the voltage applied between the positive-side electrode and the negative-side electrode of the power semiconductor element 1. As a result, the gate charge amount lower limit reference value 15b and the gate charge amount upper limit reference value 16b can be appropriately set in accordance with the operating environment of the power semiconductor element 1, thereby ensuring the detection of arm short circuit state.

In the present embodiment, the electrical quantity corresponding to the gate current of the power semiconductor element 1 is detected by the differential amplifier 21 detecting the voltage across the resistor 7 connected to the control electrode of the power semiconductor element 1, as with Embodiment 3. However, the present embodiment is not limited thereto. As with Embodiments 1 and 2, the current sensor 8 may detect the electrical quantity corresponding to the gate current. Alternatively, the electrical quantity corresponding to the gate current of the power semiconductor element 1 may be detected by detecting the voltage across the on-gate resistor 7a, as with Embodiment 4. As with Embodiment 5, the protection circuit 400 may cause the power semiconductor element 1 to transition to the blocking state if the power semiconductor element 1 is in the arm short circuit state.

Embodiment 9

Figure 10:
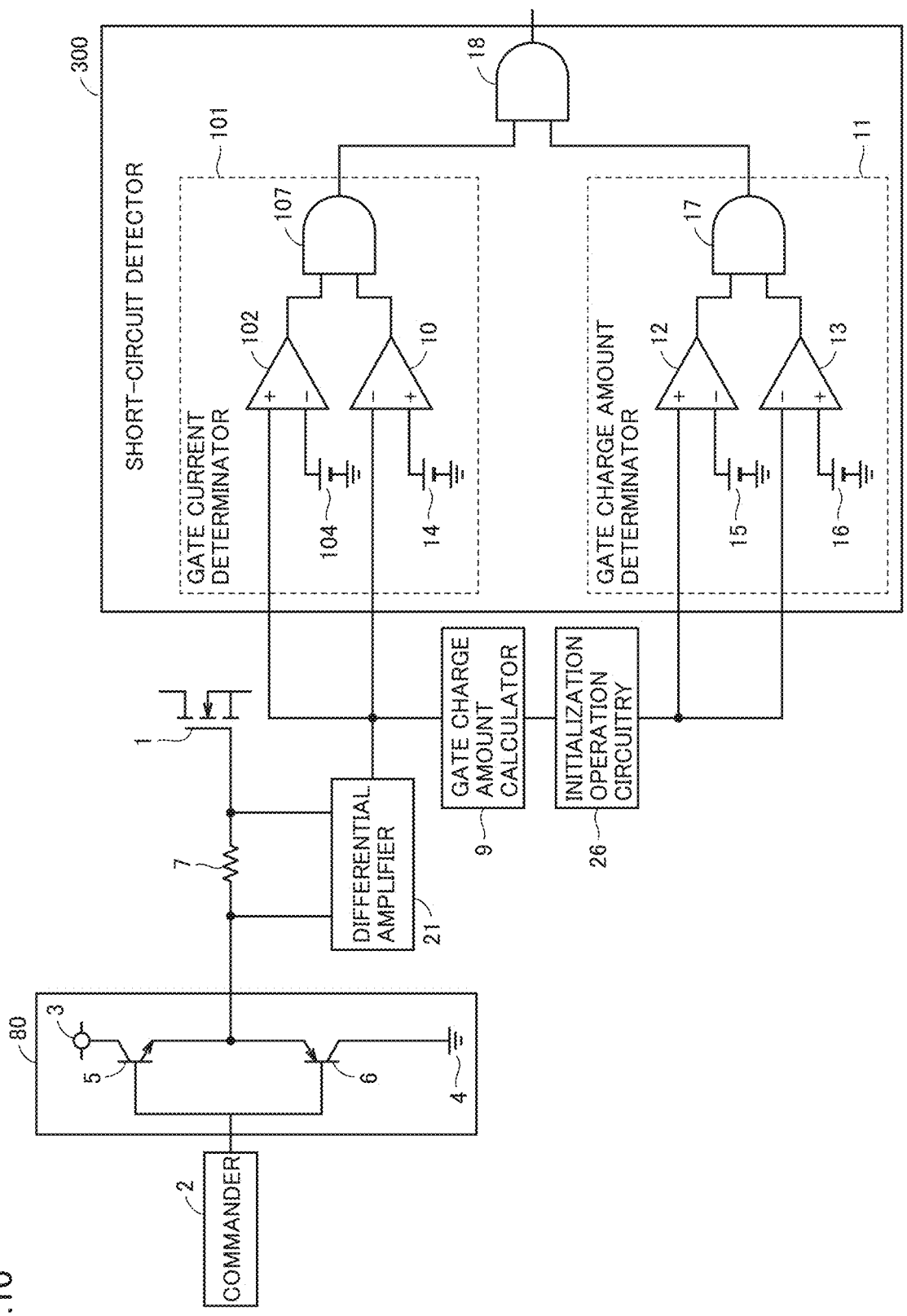
FIG. 10 is a diagram showing a drive control circuit for power semiconductor element, according to Embodiment 9.

FIG. 10 is a diagram showing a drive control circuit for power semiconductor element, according to Embodiment 9. The drive control circuit for power semiconductor element according to Embodiment 9 of FIG. 10 differs from the power semiconductor element 1 according to Embodiment 3 of FIG. 4 in that the drive control circuit for power semiconductor element according to Embodiment 9 includes an initialization operation circuitry 26.

The initialization operation circuitry 26 initializes the output signal of the gate charge amount calculator 9 to zero in response to a moment a gate current Ig starts flowing in the turn-on operation of the power semiconductor element 1. This allows the gate charge amount calculator 9 to accurately calculate the gate charge amount Qg, thereby avoiding false detection of the arm short circuit by the arm short circuit detection logical operation circuitry 18.

In the present embodiment, the voltage across the resistor 7 connected to the control electrode of the power semiconductor element 1 is detected by the differential amplifier 21 detecting the electrical quantity corresponding to the gate current of the power semiconductor element 1, as with Embodiment 3. However, the present embodiment is not limited thereto. As with Embodiments 1 and 2, the current sensor 8 may detect the electrical quantity corresponding to the gate current. Alternatively, the electrical quantity corresponding to the gate current of the power semiconductor element 1 may be detected by detecting the voltage across the on-gate resistor 7a, as with Embodiment 4. As with Embodiment 5, the protection circuit 400 may cause the power semiconductor element 1 to transition to the blocking state if the power semiconductor element 1 is in the arm short circuit.

Embodiment 10

In the embodiments described above, the short-circuit state has been described with reference to the arm short circuit. However, besides the arm short circuit, the short-circuit state includes a load short circuit in which a load such as a motor connected to the power semiconductor element 1 is subjected to the short-circuit state. In the event of load short circuit, the voltage (the drain-to-source voltage) between the positive-side electrode and the negative-side electrode of the power semiconductor element 1 decreases to an on-state voltage, after which the drain current rapidly increases accompanied with an increase of the drain-to-source voltage, as with the typical turn-on operation. With the increase of the drain-to-source voltage, the drain-to gate capacitance (the feedback capacitance) decreases, causing the current to flow from the drain terminal of the power semiconductor element 1 to the driver 80 via the gate terminal. Consequently, a gate current Ig turns into negative, and a gate charge amount Qg decreases.

Figure 11:
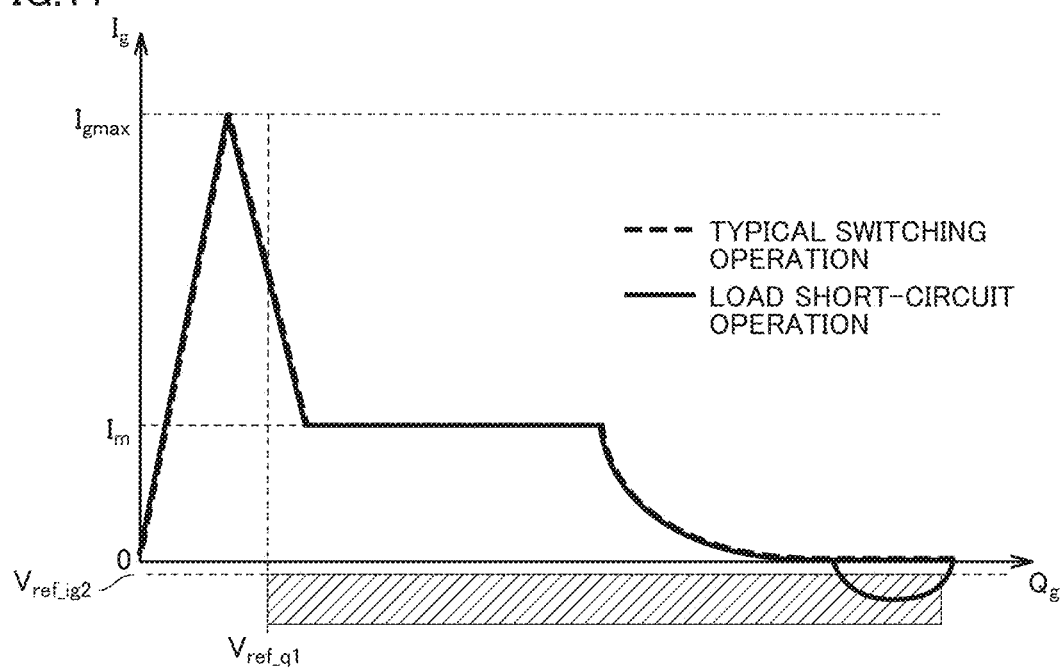
FIG. 11 is a diagram for illustrating a principle of detection of load short circuit based on a gate current Ig and a gate charge amount Qg.

FIG. 11 is a diagram for illustrating a principle of detection of the load short circuit based on the relationship between the gate current Ig and the gate charge amount Qg.

The waveform in dotted line indicates the gate current Ig versus the gate charge amount Qg in the typical switching operation. The waveform in the solid line indicates the gate current Ig versus the gate charge amount Qg in the load short circuit operation.

The relationship between the gate current Ig and the gate charge amount Qg in the load short circuit state is similar to that in the typical switching operation part way through. In other words, the gate current Ig increases over time to the peak value (Igmax), and then decreases. Subsequently, the gate current Ig undergoes a period (a mirror period) during which the gate current Ig is at a constant current value (Im), and then decreases again. In the load short circuit operation, the gate current Ig turns into negative, as described above.

In other words, the gate current Ig flows from the power semiconductor element 1 to the driver 80. Since the gate current Ig changes to negative, the gate charge amount Qg, represented as the time integral of the gate current Ig, decreases. As such, the typical switching operation and the load short circuit operation are different on the relationship between the gate current Ig and the gate charge amount Qg. The drive control circuit for power semiconductor element according to the present embodiment exploits such a difference to detect the load short circuit state.

A gate current upper limit reference value 14c is set to a value (Vref_ig2) lower than zero.

A gate charge amount lower limit reference value 15 is set to a value (Vref_q1) higher than the charge amount where the gate current is at the peak value (Igmax). Having set the reference value as such, the load can be determined to be in the short-circuit state if the gate current Ig is in the range of Ig≤Vref_ig2 and the gate charge amount Qg is in the range of Vref_q1≤Qg (the hatched area of FIG. 11).

Figure 12:
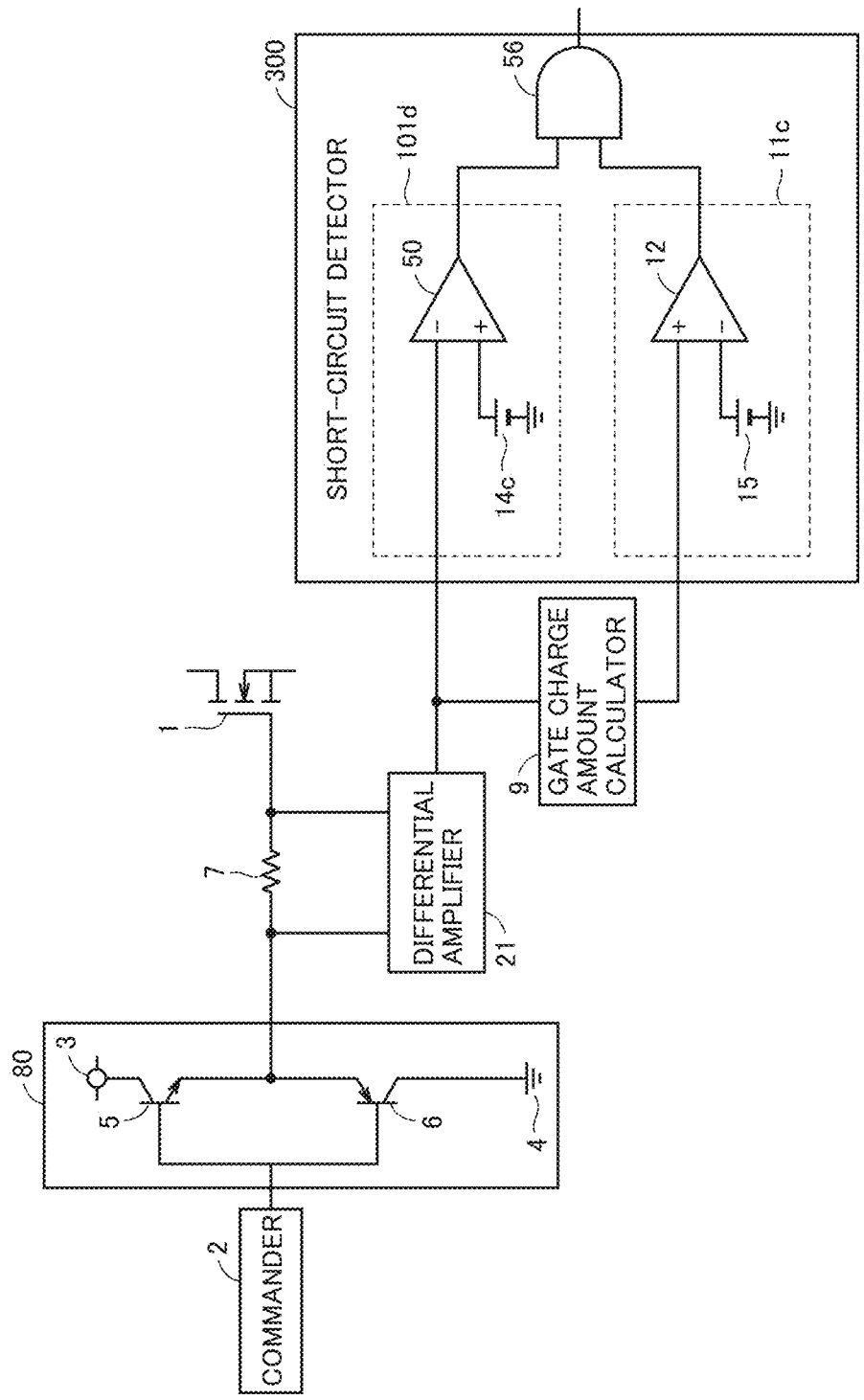
FIG. 12 is a diagram showing a drive control circuit for power semiconductor element, according to Embodiment 10.

FIG. 12 is a diagram showing a drive control circuit for power semiconductor element, according to Embodiment 10. The drive control circuit for power semiconductor element according to Embodiment 10 of FIG. 12 differs from the power semiconductor element 1 according to Embodiment 3 of FIG. 4 in that the drive control circuit for power semiconductor element according to Embodiment 10 includes a short-circuit detector 300d, instead of the short-circuit detector 300.

The short-circuit detector 300d includes a gate current determinator 101d, a gate charge amount determinator 11c, and a load short-circuit detection logical operation circuitry 56, instead of the gate current determinator 101, the gate charge amount determinator 11, and the arm short circuit detection logical operation circuitry 18.

The gate current determinator 101d determines whether the gate current Ig is lower than or equal to the gate current upper limit reference value 14c. The gate current determinator 101d outputs a high-level signal if the gate current Ig is lower than or equal to the gate current upper limit reference value 14c.

The gate current determinator 101d includes a third comparator 50 for gate current. The third comparator 50 for gate current compares the output signal of a differential amplifier 21 with the gate current upper limit reference value 14c. The third comparator 50 for gate current outputs a high-level signal if the output signal of the differential amplifier 21 is lower than or equal to the gate current upper limit reference value 14c.

The gate charge amount determinator 11c determines whether the gate charge amount Qg is higher than or equal to the gate charge amount lower limit reference value 15. The gate charge amount determinator 11c outputs a high-level signal if the gate charge amount Qg is higher than or equal to the gate charge amount lower limit reference value 15. The gate charge amount determinator 11c includes a first comparator 12 for gate charge amount.

The first comparator 12 for gate charge amount compares the output signal (the gate charge amount Qg) of the gate charge amount calculator 9 with the gate charge amount lower limit reference value 15. The first comparator 12 for gate charge amount outputs a high-level signal if the output signal (the gate charge amount Qg) of the gate charge amount calculator 9 is higher than or equal to the gate charge amount lower limit reference value 15.

The load short circuit detection logical operation circuitry 56 outputs the logical AND of the output signal of the third comparator 50 for gate current of the gate current determinator 101d and the output signal of the first comparator 12 for gate charge amount of the gate charge amount determinator 11c. If the gate current Ig is lower than or equal to the gate current upper limit reference value 14c and the gate charge amount Qg is higher than or equal to the gate charge amount lower limit reference value 15, the load short circuit detection logical operation circuitry 56 determines that the load is in the short-circuit state, and outputs a high-level signal indicating so.

In the present embodiment, the electrical quantity corresponding to the gate current of the power semiconductor element 1 is detected by the differential amplifier 21 detecting the voltage across the resistor 7 connected to the control electrode of the power semiconductor element 1, as with Embodiment 3. However, the present embodiment is not limited thereto. As with Embodiments 1 and 2, the current sensor 8 may detect the electrical quantity corresponding to the gate current. Alternatively, the electrical quantity corresponding to the gate current of the power semiconductor element 1 may be detected by detecting the voltage across the on-gate resistor 7a, as with Embodiment 4. As with Embodiment 5, the protection circuit 400 may cause the power semiconductor element 1 to transition to the blocking state if the load is in the short-circuit state.

Embodiment 11

Figure 13:
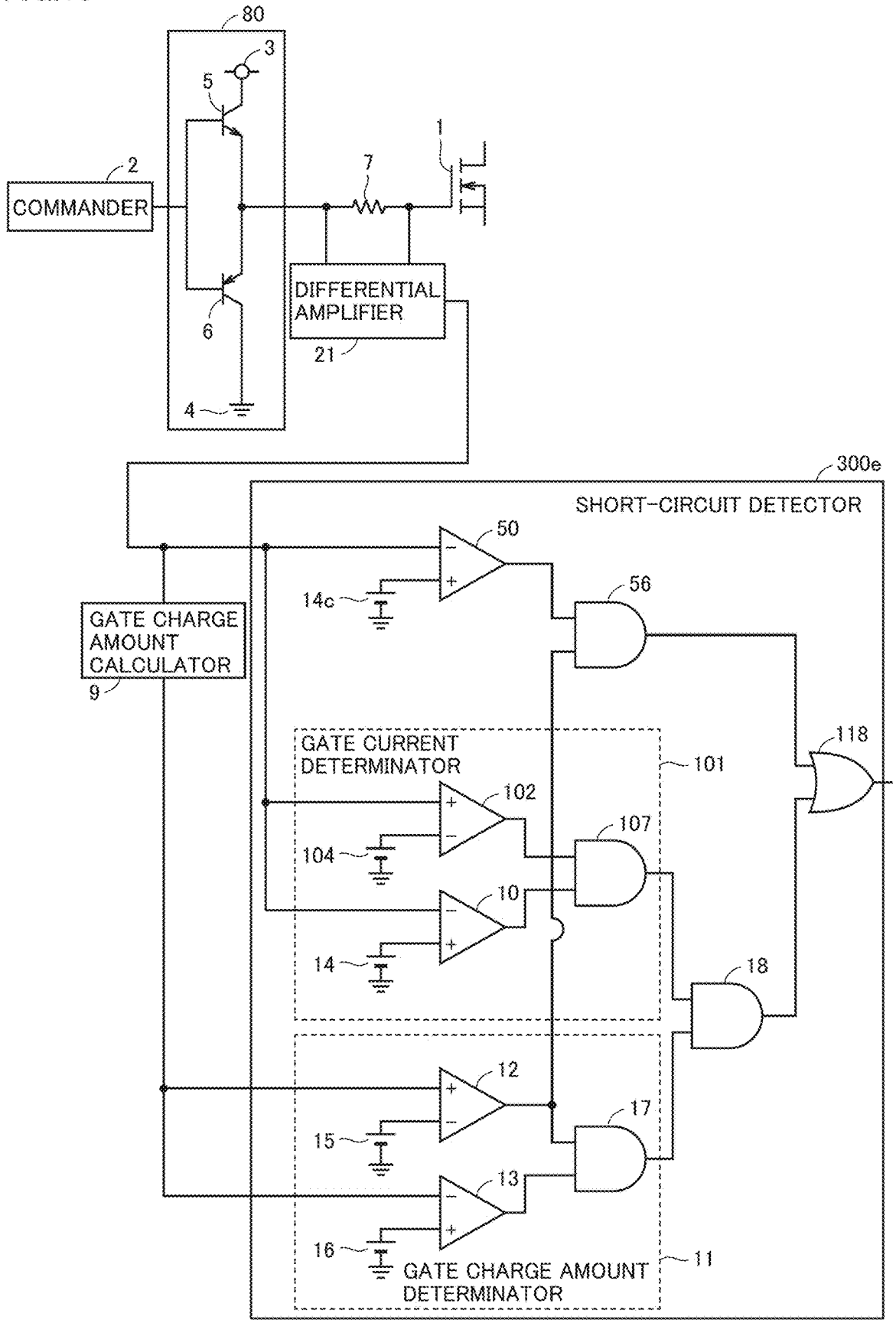
FIG. 13 is a diagram showing a drive control circuit for power semiconductor element, according to Embodiment 11.

FIG. 13 is a diagram showing a drive control circuit for power semiconductor element, according to Embodiment 11. The drive control circuit for power semiconductor element according to Embodiment 11 of FIG. 13 differs from the power semiconductor element 1 according to Embodiment 1 of FIG. 1 in that the drive control circuit for power semiconductor element according to Embodiment 11 further includes a third comparator 50 for gate current and a load short-circuit detection logical operation circuitry 56 that are similar to those in Embodiment 10. The drive control circuit for power semiconductor element according to Embodiment 11 further includes a short-circuit determinator 118.

The gate charge amount determinator 11 includes a first comparator 12 for gate charge amount which is used to detect both an arm short circuit and a load short circuit.

The third comparator 50 for gate current compares the output signal of a differential amplifier 21 with a gate current upper limit reference value 14c. The third comparator 50 for gate current outputs a high-level signal if the output signal of the differential amplifier 21 is lower than or equal to the gate current upper limit reference value 14c.

The first comparator 12 for gate charge amount compares the output signal (a gate charge amount Qg) of the gate charge amount calculator 9 with a gate charge amount lower limit reference value 15. The first comparator 12 for gate charge amount outputs a high-level signal if the output signal (the gate charge amount Qg) of the gate charge amount calculator 9 is higher than or equal to the gate charge amount lower limit reference value 15.

The load short circuit detection logical operation circuitry 56 outputs the logical AND of the output signal of the third comparator 50 for gate current and the output signal of the first comparator 12 for gate charge amount. If a gate current Ig is lower than or equal to the gate current upper limit reference value 14c and the gate charge amount Qg is higher than or equal to the gate charge amount lower limit reference value 15, the load short circuit detection logical operation circuitry 56 deteiiiiiines that the load is in the short-circuit state, and outputs a high-level signal indicating so.

The short-circuit determinator 118 outputs the logical OR of the output signal of the arm short circuit detection logical operation circuitry 18 and the output signal of the load short circuit detection logical operation circuitry 56. The short-circuit determinator 118 outputs a high-level signal indicative of a short circuit if at least one of the output signal of the arm short circuit detection logical operation circuitry 18 and the output signal of the load short circuit detection logical operation circuitry 56 is a high-level signal.

In the present embodiment, since both the arm short circuit and the load short circuit can be detected, the power semiconductor element can be surely protected.

In the present embodiment, the short-circuit determinator 118 outputs a high-level signal if at least one of a load short circuit and an arm short circuit is detected. However, the present embodiment is not limited thereto. As with Embodiment 7, the short-circuit determinator 118 may output a low-level signal by inverting the logic.

In the present embodiment, the electrical quantity corresponding to the gate current of the power semiconductor element 1 is detected by the differential amplifier 21 detecting the voltage across the resistor 7 connected to the control electrode of the power semiconductor element 1, as with Embodiment 3. However, the present embodiment is not limited thereto. As with Embodiments 1 and 2, the current sensor 8 may detect the electrical quantity corresponding to the gate current. Alternatively, the electrical quantity corresponding to the gate current of the power semiconductor element 1 may be detected by detecting the voltage across the on-gate resistor 7a, as with Embodiment 4. As with Embodiment 5, the protection circuit 400 may cause the power semiconductor element 1 to transition to the blocking state if an arm short circuit or a load short circuit is detected.

Embodiment 12

The present embodiment is application of the power semiconductor element 1 and the drive control circuit according to the embodiments described above to a power converter. While the present disclosure is not limited to a particular power converter, application of the present disclosure to a three-phase inverter will be described below as an embodiment.

Figure 14:
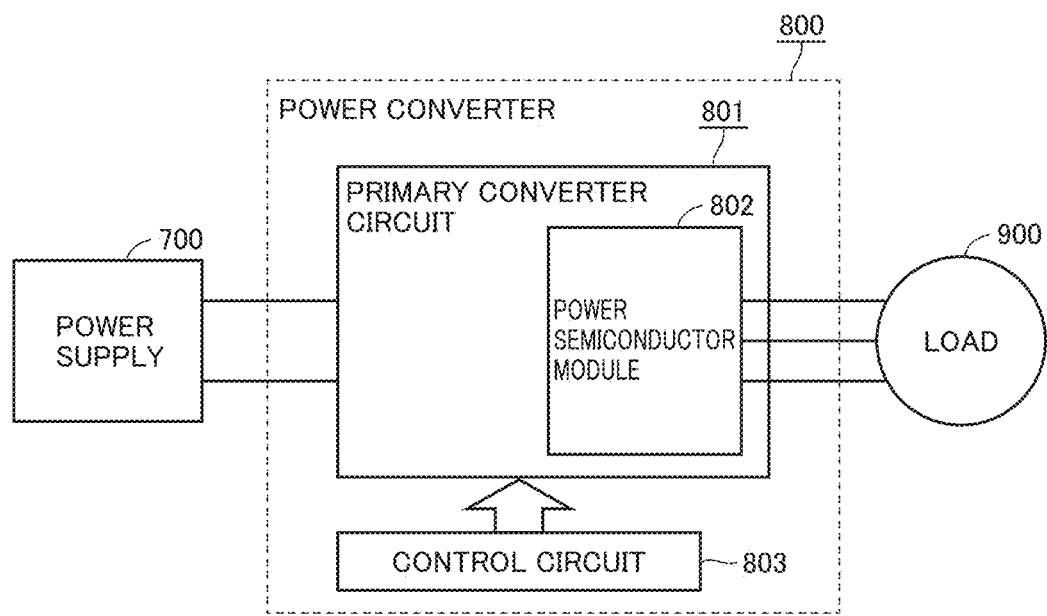
FIG. 14 is a block diagram showing a configuration of a power conversion system, according to Embodiment 12.

FIG. 14 is a block diagram showing a configuration of a power conversion system according to Embodiment 12.

The power conversion system includes a power supply 700, a power converter 800, and a load 900. The power supply 700 is a DC power supply which supplies the power converter 800 with a DC power. The power supply 700 can be configured of various elements. For example, the power supply 700 may be configured of a DC power system, a photovoltaic cell, a storage battery, a rectifier circuit connected to an AC power system, or an AC-to-DC converter. The power supply 700 may be configured of a DC-to-DC converter which converts the DC power output from a DC power system into a predetermined power.

The power converter 800 is a three-phase inverter connected between the power supply 700 and the load 900. The power converter 800 converts the DC power supplied from the power supply 700 into an AC power, and supplies the AC power to the load 900. The power converter 800 includes a primary converter circuit 801, which converts DC power into AC power and outputs the AC power, and a control circuit 803 which outputs to the primary converter circuit 801 a control signal for controlling the primary converter circuit 801.

The load 900 is a three-phase electric motor driven by the AC power supplied from power converter 800. The load 900 is not limited to a particular application, and may be an electric motor mounted on various electric appliances. For example, the load 900 is used as an electric motor for hybrid automobiles or electric automobiles, rolling stocks, elevators, or air-conditioning equipment.

In the following, the power converter 800 will be described in detail.

The primary converter circuit 801 includes a power semiconductor module 802. The power semiconductor module 802 includes a power semiconductor element 1, which is a switching element, and a freewheeling diode (not shown). As the switching element is switched, the DC power supplied from the power supply 700 is converted into AC power, which is then supplied to the load 900. While there are various specific circuit configurations for the power semiconductor module 802, the power semiconductor module 802 according to the present embodiment is a three-phase two-level full-bridge circuit which includes six switching elements and six freewheeling diodes anti-parallel to the respective switching elements. Every two switching elements are connected in series, among the six switching elements, and constitute an upper or lower arm, and the upper and lower arms each configure each phase (U-phase, V-phase, W-phase) of the full-bridge circuit. Then, output terminals of the upper and lower arms, that is, three output terminals of the primary conversion circuit 801 are connected to the load 900.

The power semiconductor module 802 includes the drive control circuit described in the above embodiments. The drive control circuit drives respective switching elements. The drive control circuit is built in the power semiconductor module 802.

The drive control circuit generates a drive signal for driving a switching element included in the primary conversion circuit 801, and supplies the drive signal to a control electrode of the switching element included in the primary conversion circuit 801. Specifically, the drive control circuit outputs to the control electrode of each switching element a drive signal for bringing the switching element into an on-state, and a drive signal for bringing the switching element into an off-state, according to the control signal from the control circuit 803 described below. To maintain the switching element in the on-state, the drive signal is a voltage signal (on-signal) higher than or equal to a threshold voltage of the switching element. To maintain the switching element in the off-state, the drive signal is a voltage signal (off-signal) lower than or equal to the threshold voltage of the switching element.

The control circuit 803 controls the switching element included in the primary conversion circuit 801 so that desired power is supplied to the load 900. Specifically, the control circuit 803 calculates a time (on-time) at which each switching element included in the primary conversion circuit 801 should be in the on-state, based on power to be supplied to the load 900. For example, the control circuit 803 can control the primary conversion circuit 801 by performing a PWM control in which the on-time of the switching elements is modulated according to a voltage to be output to the switching element. The control circuit 803 then outputs a control command (the control signal) to the drive control circuit included in the primary conversion circuit 801 so that the on-signal is output at each time point to a switching element to be in the on-state and the off-signal is output at each time point to a switching element to be in the off-state. The drive control circuit outputs the on-signal or off-signal, as the drive signal, to the control electrode of each switching element, according to the control signal.

The present embodiment has been described with reference to applying the present disclosure to the two-level three-phase inverter. However, the present disclosure is not limited thereto. The present disclosure is applicable to various power converters. In the present embodiment, the present disclosure is applied to the two-level power converter by way of example. However, the present disclosure is also applicable to a three-level or multi-level power converter. The present disclosure may be applied to a single-phase inverter where a power is supplied to a single-phase load. The present disclosure is also applicable to a DC-to-DC converter or AC-to-DC converter to supply power to a DC load, for example.

The power converter having the present disclosure applied thereto is not limited to the cases where the aforementioned load is an electric motor. The power converter may be used as a power supply for an electric discharge machine, a laser processing machine, an induction heating cooker device, or a wireless power transfer system, or as a power conditioner for a photovoltaic power system or an electricity storage system, for example.

The presently disclosed embodiments should be considered illustrative in all aspects and do not limit the present disclosure. The scope of the present disclosure is defined by the appended claims, rather than by the above description. All changes which come within the meaning and range of equivalency of the appended claims are intended to be embraced within their scope.

REFERENCE SIGNS LIST 11, 11a, 11b, 11c gate charge amount determinator; 12, 12a, 12b, 102, 102a first comparator; 14, 14b, 14c gate current upper limit reference value; 15, 15b gate charge amount lower limit reference value; 16, 16b gate charge amount upper limit reference value; 17, 17a logical operation circuitry for gate charge amount; 18, 18a arm short circuit detection logical operation circuitry; 19 on-switch circuit; 20 off-switch circuit; 21 differential amplifier; 22 latch circuit; 23 inverting circuit; 25 filter; 26 initialization operation circuitry; 56 load short circuit detection logical operation circuitry; 80, 80a driver; 101, 101a, 101b, 101c, 101d gate current determinator; 104 gate current lower limit reference value; 107, 107a logical operation circuitry for gate current; 118 short-circuit determinator; 300, 300a, 300b, 300c, 300d short-circuit detector; 400 protection circuit; 700 power supply; 800 power converter; 801 primary converter circuit; 802 power semiconductor module; 803 control circuit; 900 load; Ig gate current; ND1 node; and Qg gate charge amount.

The invention claimed is:

1. A drive control circuit for a power semiconductor element having a control electrode, a positive-side electrode, and a negative-side electrode, the drive control circuit comprising:
   a driver to drive the power semiconductor element by transitioning a voltage applied between the control electrode and the negative-side electrode;
   a gate current detector to detect a gate current flowing between the driver and the control electrode;
   a gate charge amount calculator to calculate a gate charge amount to be supplied to the power semiconductor element, based on an amount of the gate current detected by the gate current detector; and a short-circuit detector to detect an arm short circuit or a load short circuit, based on a magnitude of the gate current and a magnitude of the gate charge amount, the short-circuit detector including:

a gate current determinator to compare the magnitude of the gate current with at least one reference value;

a gate charge amount determinator to compare the magnitude of the gate charge amount with at least one reference value; and a short-circuit detection logical operation circuitry to execute a logical operation of an output signal of the gate current determinator and an output signal of the gate charge amount determinator.

2. The drive control circuit for power semiconductor element according to claim 1, wherein the gate current detector detects a magnitude of a current flowing through a line between the driver and the control electrode, the gate current determinator includes:

a first comparator for gate current that compares the magnitude of the gate current with a gate current lower limit reference value higher than zero;

a second comparator for gate current that compares the magnitude of the gate current with a gate current upper limit reference value; and a logical operation circuitry for gate current that executes a logical operation of an output signal of the first comparator for gate current and an output signal of the second comparator for gate current, the gate charge amount determinator includes:

a first comparator for gate charge amount that compares the magnitude of the gate charge amount with a gate charge amount lower limit reference value;

a second comparator for gate charge amount that compares the magnitude of the gate charge amount with a gate charge amount upper limit reference value; and a logical operation circuitry for gate charge amount that executes a logical operation of an output signal of the first comparator for gate charge amount and an output signal of the second comparator for gate charge amount, wherein the short-circuit detection logical operation circuitry detects a short-circuit state of the power semiconductor element by executing a logical operation of an output signal of the logical operation circuitry for gate current and an output signal of the logical operation circuitry for gate charge amount.

3. The drive control circuit for power semiconductor element according to claim 1, wherein the driver includes a positive gate voltage source, a first transistor, an on-gate resistor, an off-gate resistor, a second transistor, and a reference potential, which are connected in series, wherein a node between the on-gate resistor and the off-gate resistor is connected to the control electrode of the power semiconductor element, the gate current detector detects a magnitude of a current flowing from the first transistor to the on-gate resistor, wherein the gate current determinator includes a second comparator for gate current that compares the magnitude of the gate current with a gate current upper limit reference value, the gate charge amount determinator includes:

a first comparator for gate charge amount that compares the magnitude of the gate charge amount with a gate charge amount lower limit reference value;

a second comparator for gate charge amount that compares the magnitude of the gate charge amount with a gate charge amount upper limit reference value; and a logical operation circuitry for gate charge amount that executes a logical operation of an output signal of the first comparator for gate charge amount and an output signal of the second comparator for gate charge amount, wherein the short-circuit detection logical operation circuitry detects a short-circuit state of the power semiconductor element by executing a logical operation of an output signal of the second comparator for gate current and an output signal of the logical operation circuitry for gate charge amount.

4. The drive control circuit for power semiconductor element according to claim 2, wherein the gate current upper limit reference value is lower than a value of a gate current during a mirror period in a typical switching operation, the gate charge amount lower limit reference value is higher than a gate charge amount where the gate current is at a peak value in the typical switching operation, and the gate charge amount upper limit reference value is lower than a gate charge amount at end of the mirror period in the typical switching operation.

5. The drive control circuit for power semiconductor element according to claim 2, wherein the gate current upper limit reference value is set so as to vary in response to a temperature, and the gate charge amount lower limit reference value and the gate charge amount upper limit reference value are set so as to vary in response to a voltage applied between the positive-side electrode and the negative-side electrode of the power semiconductor element.

6. The drive control circuit for power semiconductor element according to claim 1, wherein the gate current detector detects a magnitude of a current flowing through a line between the driver and the control electrode, the gate current determinator includes a third comparator for gate current that compares the magnitude of the gate current with a gate current upper limit reference value, the gate charge amount determinator includes a first comparator for gate charge amount that compares the magnitude of the gate charge amount with a gate charge amount lower limit reference value, wherein the gate current upper limit reference value is lower than zero, the gate charge amount lower limit reference value is higher than a gate charge amount where the gate current is at a peak value in a typical switching operation, and the short-circuit detection logical operation circuitry detects a short-circuit state of the power semiconductor element, based on an output signal of the third comparator for gate current and an output signal of the first comparator for gate charge amount.

7. The drive control circuit for power semiconductor element according to claim 2, wherein the short-circuit detector further includes:

a third comparator for gate current that compares the magnitude of the gate current with another gate current upper limit reference value lower than zero; and a load short circuit detection logical operation circuitry that detects the short-circuit state of the power semiconductor element by executing a logical operation of an output signal of the third comparator for gate current and the output signal of the first comparator for gate charge amount.

8. The drive control circuit for power semiconductor element according to claim 2, wherein
the gate current detector is a current sensor.

9. The drive control circuit for power semiconductor element according to claim 2, comprising
a resistor disposed on the line between the driver and the control electrode, wherein
the gate current detector is a differential amplifier that detects a magnitude of a voltage across the resistor.

10. The drive control circuit for power semiconductor element according to claim 3, wherein
the gate current detector is a differential amplifier that detects a magnitude of a voltage across the on-gate resistor.

11. The drive control circuit for power semiconductor element according to claim 1, comprising
a filter to reshape a waveform of an output signal of the gate current detector with a predetermined time constant, wherein
an output signal of the filter is sent to the gate charge amount calculator and the short-circuit detector.

12. The drive control circuit for power semiconductor element according to claim 1, comprising:
a commander to output a command for causing the driver to turn on the power semiconductor element or a command for causing the driver to turn off the power semiconductor element; and
a protection circuit to output, when the short-circuit detector detects the arm short circuit or the load short circuit, the command for causing the driver to turn off the power semiconductor element, irrespective of a command from the commander.

13. The drive control circuit for power semiconductor element according to claim 1, comprising
an operation circuitry for initializing an output signal of the gate charge amount calculator.

14. The drive control circuit for power semiconductor element according to claim 1, wherein
the power semiconductor element is any of a Si-IGBT, an RC-IGBT, a SiC-MOSFET, a GaN transistor, and a Ga2O3 transistor.

15. A power semiconductor module, comprising:
the drive control circuit for power semiconductor element according to claim 1; and
the power semiconductor element.

16. A power converter, comprising:
a primary converter circuit to have the power semiconductor module according to claim 15, and convert and output input power; and
a control circuit to output to the primary converter circuit a control signal for controlling the primary converter circuit.

* * * * *